US012648292B2

(12) United States Patent
Kim et al.

(10) Patent No.: US 12,648,292 B2
(45) Date of Patent: Jun. 2, 2026

(54) ELECTROLUMINESCENT DEVICE AND A DISPLAY DEVICE INCLUDING THE SAME

(71) Applicant: SAMSUNG ELECTRONICS CO., LTD., Suwon-si (KR)

(72) Inventors: Sung Woo Kim, Suwon-si (KR); Tae Ho Kim, Suwon-si (KR); You Jung Chung, Suwon-si (KR); Taehyung Kim, Suwon-si (KR); Ilyoung Lee, Suwon-si (KR); Heejae Lee, Suwon-si (KR); Moon Gyu Han, Suwon-si (KR)

(73) Assignees: SAMSUNG DISPLAY CO., LTD., Gyeonggi-Do (KR); SAMSUNG ELECTRONICS CO., LTD., Gyeonggi-Do (KR)

( * ) Notice: Subject to any disclaimer, the term of this patent is extended or adjusted under 35 U.S.C. 154(b) by 451 days.

(21) Appl. No.: 18/463,385

(22) Filed: Sep. 8, 2023

(65) Prior Publication Data

US 2024/0090252 A1 Mar. 14, 2024

(30) Foreign Application Priority Data

Sep. 8, 2022 (KR) ........................ 10-2022-0114503

(51) Int. Cl.
*H10K 50/115* (2023.01)
*B82Y 20/00* (2011.01)
(Continued)

(52) U.S. Cl.
CPC ............ *H10K 50/115* (2023.02); *C09K 11/54* (2013.01); *C09K 11/623* (2013.01); *H10K 50/16* (2023.02); *B82Y 20/00* (2013.01)

(58) Field of Classification Search
CPC ................. H10K 50/115; H10K 50/16; H10K 50/81–82; H10K 59/12; H10K 59/90;
(Continued)

(56) References Cited

U.S. PATENT DOCUMENTS 4,853,594 A 8/1989 Thomas
10,991,899 B2 4/2021 Kim et al.
(Continued)

FOREIGN PATENT DOCUMENTS

CN 114335365 A 4/2022
KR 20200088695 A 7/2020
(Continued)

OTHER PUBLICATIONS

Extended European Search Report dated Jan. 25, 2024, of the corresponding European Patent Application No. 23196217.6, 7 pp.
(Continued)

*Primary Examiner* — Anne M Hines
*Assistant Examiner* — Jose M Diaz
(74) *Attorney, Agent, or Firm* — CANTOR COLBURN LLP

(57) ABSTRACT

An electroluminescent device including a first electrode and a second electrode facing each other; a light emitting layer disposed between the first electrode and the second electrode; and an electron transport layer disposed between the light emitting layer and the second electrode. The light emitting layer includes a plurality of semiconductor nanoparticles, and the electron transport layer includes a plurality of zinc oxide nanoparticles, the zinc oxide nanoparticles further include magnesium and gallium.

20 Claims, 4 Drawing Sheets

(51) Int. Cl.

| | |
|---|---|
| *C09K 11/54* | (2006.01) |
| *C09K 11/62* | (2006.01) |
| *H10K 50/16* | (2023.01) |

(58) Field of Classification Search

CPC ........ H10K 71/12; H10K 71/60; C09K 11/54; C09K 11/623; C09K 11/625; B82Y 20/00; B82Y 30/00; B82Y 40/00; H05B 33/10; H05B 33/28

See application file for complete search history.

(56) References Cited

U.S. PATENT DOCUMENTS

| | | |
|---|---|---|
| 2020/0321490 A1 | 10/2020 | Yang et al. |
| 2021/0119161 A1* | 4/2021 | Han ..................... H10K 50/165 |
| 2021/0376278 A1 | 12/2021 | Lee et al. |
| 2022/0255007 A1 | 8/2022 | Inokuchi et al. |

FOREIGN PATENT DOCUMENTS

| | | |
|---|---|---|
| KR | 102181060 B1 | 11/2020 |
| KR | 20210149963 A | 12/2021 |

OTHER PUBLICATIONS

Hong Hee Kim, et al., Optimization of the electron transport in quantumdot light-emitting diodes by codoping ZnO withgallium (Ga) and magnesium (Mg), RSC Adv., 2019, 9, 32066-32071.

Jong-Hoon Kim et al, "Performance Improvement of Quantum Dot-Light-Emitting Diodes Enabled by an Alloyed ZnMgO Nanoparticle Electron Transport Layer", Chemistry of Materials, US, (Dec. 18, 2014), vol. 27, No. 1, pp. 197-204.

* cited by examiner

ELECTROLUMINESCENT DEVICE AND A DISPLAY DEVICE INCLUDING THE SAME

CROSS-REFERENCE TO RELATED APPLICATION

This application claims priority to Korean Patent Application No. 10-2022-0114503 filed in the Korean Intellectual Property Office on Sep. 8, 2022, and all the benefits accruing therefrom under 35 U.S.C. § 119, the entire content of which is incorporated herein by reference.

BACKGROUND

1. Field

The present disclosure relates to a display device (e.g., electroluminescent display device) and a light emitting device.

2. Description of the Related Art

A semiconductor particle having a nanoscale size (e.g., a semiconductor nanocrystal particle) may exhibit luminescence. For example, a quantum dot including a semiconductor nanocrystal may exhibit a quantum confinement effect. Light emission from the semiconductor nanoparticle may be result when electrons in an excited state transit from a conduction band to a valence band by, for example, light excitation or voltage application. A semiconductor nanoparticle may be controlled to emit light in a desired wavelength region by controlling their size and/or composition. The nanoparticle may be used in a light emitting device (e.g., an electroluminescent device) and a display device including the nanoparticle.

SUMMARY

An embodiment relates to a light emitting device that emits light by applying a voltage to a nanostructure (e.g., a quantum dot).

An embodiment relates to a display device (e.g., a QD-LED display) including a semiconductor nanoparticle (e.g., a quantum dot) as a light emitting material in one or more pixels.

In an embodiment, an electroluminescent device includes:
a first electrode and a second electrode spaced apart from each other, for example, each with a surface opposite the other;
a light emitting layer disposed between the first electrode and the second electrode; and
an electron transport layer disposed between the light emitting layer and the second electrode,
wherein the light emitting layer includes a semiconductor nanoparticle (e.g., a plurality of semiconductor nanoparticles), and the electron transport layer includes a zinc oxide nanoparticle (e.g., a plurality of zinc oxide particles),
wherein the zinc oxide nanoparticle comprises magnesium and gallium, and in the zinc oxide nanoparticle, an amount of gallium is greater than or equal to about 1 mol % and less than or equal to about 30 mol %, based on a total amount of zinc, magnesium, and gallium, and a mole ratio of gallium to magnesium (Ga:Mg) is less than or equal to about 3:1.

The electroluminescent device may further include a hole auxiliary layer disposed between the light emitting layer and the first electrode. The hole auxiliary layer may include a hole transport layer (e.g., including an organic compound), a hole injection layer, or a combination thereof.

The semiconductor nanoparticle may not contain cadmium.

The semiconductor nanoparticle may not contain lead, mercury, or a combination thereof.

The semiconductor nanoparticle may include a first semiconductor nanocrystal containing zinc, selenium, and tellurium, and a second semiconductor nanocrystal containing a zinc chalcogenide, the second semiconductor nanocrystal being different from the first semiconductor nanocrystal.

The semiconductor nanoparticle may include a first semiconductor nanocrystal containing indium, phosphorus, and optionally zinc, and a second semiconductor nanocrystal containing zinc chalcogenide, the second semiconductor nanocrystal being different from the first semiconductor nanocrystal.

The semiconductor nanoparticle may include a core including the first semiconductor nanocrystal and a shell disposed on the core and including the second semiconductor nanocrystal.

The second semiconductor nanocrystal may have composition that is different from the first semiconductor nanocrystal.

The semiconductor nanoparticle may include a zinc chalcogenide, and the zinc chalcogenide may include tellurium, and optionally, the semiconductor nanoparticle may be configured to emit blue light.

In the zinc oxide nanoparticle, an amount of the gallium may be greater than or equal to about 3 mole percent (mol %), or greater than or equal to about 3.5 mol %, and less than or equal to about 25 mol %, less than or equal to about 19 mol %, or less than or equal to about 17.5 mol %, based on a total amount of zinc, magnesium, and gallium.

In the zinc oxide nanoparticle, an amount of the gallium may be greater than or equal to about 10 mol %, or greater than or equal to about 12 mol %, and less than or equal to about 16 mol %, based on a total amount of zinc, magnesium, and gallium.

The electron transport layer may be adjacent to the light emitting layer (e.g., disposed directly on the light emitting layer).

In the zinc oxide nanoparticle, a mole ratio of gallium to zinc (Ga:Zn) may be greater than or equal to about 0.03:1, greater than or equal to about 0.04:1, greater than or equal to about 0.05:1, greater than or equal to about 0.07:1, greater than or equal to about 0.08:1, greater than or equal to about 0.1:1, greater than or equal to about 0.15:1, greater than or equal to about 0.18:1, greater than or equal to about 0.19:1, or greater than or equal to about 0.2:1. In the zinc oxide nanoparticles, the mole ratio of gallium to zinc (Ga:Zn) may be less than or equal to about 0.3:1, less than or equal to about 0.25:1, less than or equal to about 0.23:1, less than or equal to about 0.22:1, less than or equal to about 0.21:1, or less than or equal to about 0.2:1.

In the zinc oxide nanoparticle, a mole ratio of magnesium to zinc (Mg:Zn) may be greater than or equal to about 0.05:1, greater than or equal to about 0.07:1, greater than or equal to about 0.09:1, greater than or equal to about 0.1:1, or greater than or equal to about 0.12:1. In the zinc oxide nanoparticles, the mole ratio of magnesium to zinc (Mg:Zn) may be less than or equal to about 0.25:1, less than or equal to about 0.21:1, less than or equal to about 0.17:1, less than or equal to about 0.14:1, or less than or equal to about 0.1:1.

In the zinc oxide nanoparticle, a mole ratio of gallium to magnesium (Ga:Mg) may be greater than or equal to about

3

0.3:1, greater than or equal to about 0.32:1, greater than or equal to about 0.5:1, greater than or equal to about 0.7:1, greater than or equal to about 1:1, greater than or equal to about 1.5:1, greater than or equal to about 1.9:1, or greater than or equal to about 2:1. In the zinc oxide nanoparticle, the mole ratio of gallium to magnesium (Ga:Mg) may be less than or equal to about 2.8:1, less than or equal to about 2.7:1, less than or equal to about 2.5:1, less than or equal to about 2.4:1, less than or equal to about 2:1, less than or equal to about 1.7:1, less than or equal to about 1.4:1, or less than or equal to about 0.9:1.

In the zinc oxide nanoparticle, a mole ratio of a sum of magnesium and gallium to zinc [(Mg+Ga):Zn] may be greater than or equal to about 0.15:1, greater than or equal to about 0.18:1, greater than or equal to about 0.22:1, greater than or equal to about 0.24:1, greater than or equal to about 0.3:1, or greater than or equal to about 0.35:1. In the zinc oxide nanoparticles, the mole ratio of the sum of magnesium and gallium to zinc may be less than or equal to about 0.5:1, less than or equal to about 0.45:1, less than or equal to about 0.4:1, less than or equal to about 0.35:1, less than or equal to about 0.31:1, less than or equal to about 0.29:1, less than or equal to about 0.26:1, less than or equal to about 0.23:1, or less than or equal to about 0.2:1.

In an X-ray diffraction analysis, the zinc oxide nanoparticle may exhibit a full width at half maximum of a first peak corresponding to a (100) crystal plane of greater than or equal to about 0.5 degrees and less than or equal to about 8 degrees, for example, greater than or equal to about 0.8 degrees and less than or equal to about 5 degrees, greater than or equal to about 0.9 degrees and less than or equal to about 3 degrees, greater than or equal to about 1.2 degree and less than or equal to about 2.7 degrees, greater than or equal to about 1 degree and less than or equal to about 1.8 degrees, or a combination thereof. The full width at half maximum of the first peak may be less than or equal to about 2.8 degrees, less than or equal to about 2.7 degrees, less than or equal to about 2.6 degrees, less than or equal to about 2.5 degrees, or less than or equal to about 2 degrees.

In the X-ray diffraction analysis, the zinc oxide nanoparticle may have a full width at half maximum of a second peak corresponding to a (101) crystal plane of greater than or equal to about 0.5 degrees, greater than or equal to about 0.7 degrees, greater than or equal to about 0.9 degrees, greater than or equal to about 1.2 degrees, greater than or equal to about 1.5 degrees, greater than or equal to about 1.8 degrees, greater than or equal to about 2 degrees, greater than or equal to about 2.2 degrees, or greater than or equal to about 2.4 degrees and less than or equal to about 10 degrees, less than or equal to about 8 degrees, less than or equal to about 6 degrees, less than or equal to about 4 degrees, less than or equal to about 3 degrees, less than or equal to about 2.5 degrees, less than or equal to about 2 degrees, less than or equal to about 1.7 degrees, or less than or equal to about 1.5 degrees. The full width at half maximum of the second peak may be less than or equal to about 3.5 degrees, less than or equal to about 3.4 degrees, less than or equal to about 3.2 degrees, less than or equal to about 3 degrees, or less than or equal to about 2.8 degrees.

The first peak may have a maximum intensity at a 2-theta angle between about 30 degrees and about 35 degrees, for example, greater than or equal to about 30.5 greater than or equal to about 30.7 degrees, greater than or equal to about 31 degrees, greater than or equal to about 31.3 degrees and less than or equal to about 33 degrees, less than or equal to about 32.9 degrees, less than or equal to about 32.78 degrees, or less than or equal to about 31.8 degrees.

The second peak may have a maximum intensity at a 2-theta angle range of greater than or equal to about 33 degrees, greater than or equal to about 33.5 degrees, greater than or equal to about 34 degrees, greater than or equal to about 34.5 degrees, between about 35 degrees and about 40 degrees, for example, greater than or equal to about 35.2 degrees, greater than or equal to about 35.32 degrees, and less than or equal to about 38 degrees, less than or equal to about 37 degrees, less than or equal to about 36.74 degrees, or less than or equal to about 36.2 degrees.

The zinc oxide nanoparticle may further include halogen.

In the zinc oxide nanoparticle, a mole ratio of halogen to gallium (halogen:gallium) may be, for example, greater than or equal to about 0.01:1, greater than or equal to about 0.1:1, greater than or equal to about 0.15:1, greater than or equal to about 0.16:1, greater than or equal to about 0.17:1, as confirmed by X-ray photoelectron spectroscopy (XPS) analysis. In the zinc oxide nanoparticle, the mole ratio of halogen to gallium (halogen:gallium) may be, for example, less than or equal to about 0.5:1, less than or equal to about 0.4:1, less than or equal to about 0.3:1, or less than or equal to about 0.2:1, as determined by X-ray photoelectron spectroscopy (XPS) analysis.

The zinc oxide nanoparticle may be dispersed in a C1 to C10 alcohol solvent.

The zinc oxide nanoparticle may have an organic amount of greater than or equal to about 1 weight percent (wt %) and less than or equal to about 27 wt %, less than or equal to about 25 wt %, or less than or equal to about 24 wt %, based on a total weight of the zinc oxide nanoparticle (for example, as measured from a thermogravimetric analysis result).

In a dynamic light scattering analysis, the zinc oxide nanoparticles as dispersed in the C1 to C10 alcohol solvent may exhibit an average particle diameter (i.e. DLS average particle diameter) of greater than or equal to about 5 nm and less than or equal to about 8 nm.

The zinc oxide nanoparticle may exhibit an intensity ratio of a defective emission peak to a band edge emission peak that is less than or equal to about 10:1, less than or equal to about 8:1, or less than or equal to about 5:1, in a photoluminescence spectrum obtained by the irradiation of light having a wavelength of 300 nm.

A peak emission wavelength of the band edge emission may be in a range of greater than or equal to about 350 nm and less than or equal to about 400 nm. A peak emission wavelength of the defective emission may exist in a range of greater than or equal to about 450 nm and less than or equal to about 550 nm.

In a UV-Vis absorption spectrum, the zinc oxide nanoparticle may have a first absorption peak wavelength of less than or equal to about 320 nm, for example, less than or equal to about 315 nm, less than or equal to about 313 nm, or less than or equal to about 311 nm.

The first absorption peak wavelength may be greater than or equal to about 290 nm.

The zinc oxide nanoparticle may have an average particle size of greater than or equal to about 1 nm, for example, greater than or equal to about 3 nm. The zinc oxide nanoparticle may have an average particle size of less than or equal to about 10 nm, less than or equal to about 8 nm, less than or equal to about 5 nm, or less than or equal to about 4 nm.

The zinc oxide nanoparticle may include a core including $Zn_{1-x}M_xO$ (wherein M is Mg, Ca, Zr, W, Li, Ti, Y, Al, or a combination thereof, and $0 \leq x \leq 0.5$), and a gallium oxide (e.g., $Ga_2O_3$) shell disposed on the core. In the above Chemical Formula, x may be greater than 0, greater than or equal to about 0.01, greater than or equal to about 0.03, greater than or equal to about 0.05, greater than or equal to about 0.1, or greater than or equal to about 0.15. In an embodiment, x may be less than or equal to about 0.45, or less than or equal to about 0.4.

In the zinc oxide nanoparticle, the gallium oxide shell may have a thickness of less than or equal to about 1 nm, or less than or equal to about 0.5 nm.

The zinc oxide nanoparticle may further include an additional metal selected from an alkali metal, Ca, Zr, W, Li, Ti, Y, Al, or a combination thereof.

The alkali metal may include lithium, sodium, potassium, rubidium, cesium, or a combination thereof.

In an embodiment, the alkali metal may include potassium, cesium, rubidium, or a combination thereof, and the halogen may include chlorine.

In the electroluminescent device, the electron transport layer may have a thickness of greater than or equal to about 5 nm. The electron transport layer may have a thickness of less than or equal to about 70 nm.

The electroluminescent device may be configured to emit green light when a voltage is applied. The electroluminescent device may be configured to emit blue light when a voltage is applied. The electroluminescent device may be configured to emit red light when a voltage is applied.

The electroluminescent device has a maximum external quantum efficiency of greater than or equal to about 8%, greater than or equal to about 9%, greater than or equal to about 10%, greater than or equal to about 11%, greater than or equal to about 12%, greater than or equal to about 13%, or greater than or equal to about 14% and less than or equal to about 100%, for example, less than or equal to about 90%, or less than or equal to about 40%.

The electroluminescent device may have a maximum luminance of greater than or equal to about 60,000 candela per square meter $(cd/m^2)$, greater than or equal to about 70,000 $cd/m^2$, greater than or equal to about 80,000 $cd/m^2$, greater than or equal to about 90,000 $cd/m^2$, greater than or equal to about 100,000 $cd/m^2$, or greater than or equal to about 300,000 $cd/m^2$.

The electroluminescent device may have a maximum luminance of less than or equal to about 5,000,000 $cd/m^2$, less than or equal to about 3,000,000 $cd/m^2$, less than or equal to about 2,000,000 $cd/m^2$, or less than or equal to about 1,000,000 $cd/m^2$.

The electroluminescent device may have T50 of greater than or equal to about 250 hours, greater than or equal to about 300 hours, greater than or equal to about 350 hours, greater than or equal to about 400 hours, greater than or equal to about 480 hours, greater than or equal to about 500 hours, or greater than or equal to about 600 hours (e.g., as being driven at an initial luminance of 650 nit). The T50 may be less than or equal to about 2000 hours, less than or equal to about 1500 hours, or less than or equal to about 1000 hours.

The electroluminescent device has a T90 of greater than or equal to about 10 hours, greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, or greater than or equal to about 90 hours (e.g., as being driven at an initial luminance of 650 nit). The electroluminescent device may have a T90 of less than or equal to about 800 hours, less than or equal to about 500 hours, or less than or equal to about 300 hours (e.g., as being driven at an initial luminance of 650 nit).

In an electroluminescent device of an embodiment, an electron auxiliary layer including a zinc oxide may be disposed between the first electrode and the light emitting layer, and the device may exhibit a current density at 8 volts of greater than or equal to about 100 milliamperes per square centimeter $(mA/cm^2)$, or a current density at 5 volts of greater than or equal to about 20 $mA/cm^2$, as a voltage of 2 to 8 volts is applied to the device.

An embodiment provides a display device or an electronic apparatus including the aforementioned electroluminescent device.

The display device or the electronic apparatus may include a portable terminal device, a monitor, a notebook computer, a television, an electric sign board, a camera, or an electronic component of a vehicle.

An embodiment relates to a method for producing the aforementioned electroluminescent device. The method may include:

forming the light emitting layer on the first electrode;

applying a solution including the zinc oxide nanoparticles onto the light emitting layer to form the electron transport layer; and forming the second electrode on the electron transport layer, wherein the zinc oxide nanoparticles are prepared by a method including:

stirring a solvent mixture comprising a first solvent and a second solvent; and adding a zinc precursor and a magnesium precursor to the solvent mixture and dissolving the zinc precursor and the magnesium precursor to obtain a first solution;

adding a first base to the first solution and reacting at a first temperature to form first nanoparticles;

isolating the formed first nanoparticles and optionally, washing the first nanoparticles;

dispersing the isolated first nanoparticles in a third solvent; and adding a gallium precursor and a second base in the third solvent; and heating the third solvent at a second temperature to form the zinc oxide nanoparticle; and wherein a relative polarity difference between the first solvent and the second solvent is greater than or equal to about 0.3 and less than or equal to about 0.9.

The formed electron transport layer may be thermally treated.

The dissolving of the zinc precursor and the magnesium precursor may include a heating of the solvent mixture including the precursors at a predetermined temperature.

The first solvent may be a C1 to C10 alcohol solvent. The second solvent may be a C3 to C30 (e.g., C15) hydrocarbon solvent (e.g., an aliphatic hydrocarbon solvent, an aromatic hydrocarbon solvent, an alicyclic hydrocarbon solvent, or a solvent having a benzene ring in which one or more double bonds are hydrogenated).

The third solvent may include a C1 to C10 alcohol solvent, dimethylsulfoxide, a C3 to C30 (e.g., C3 to C15) hydrocarbon solvent (e.g., an aliphatic hydrocarbon solvent, an aromatic hydrocarbon solvent, an alicyclic hydrocarbon solvent, or a solvent having a benzene ring in which one or more double bonds are hydrogenated).

A ratio between the first solvent and the second solvent (as a volume ratio, first solvent:second solvent) may be about 1:0.3 to about 1:3, or about 1:0.5 to about 1:2, or about 1:1.

The stirring may be conducted at about 100 rpm or more, (e.g., about 300 rpm to about 700 rpm or about 400 rpm to about 500 rpm, or a combination thereof).

The predetermined temperature may be greater than or equal to about 40° C., or greater than or equal to about 50° C. The predetermined temperature may be less than or equal to about a boiling point of the first solvent (or the second solvent) or less than or equal to about 78° C., less than or equal to about 70° C., less than or equal to about 65° C., or less than or equal to about 60° C.

The first temperature may be lower than the predetermined temperature.

The first temperature and the second temperature may be greater than or equal to about 25° C. (e.g., greater than or equal to about 30° C.) and less than or equal to about 80° C.

The first base may include an inorganic base. The first base may include or may not include a tetramethylammonium moiety.

The first nanoparticles may have an amount of an organic material of greater than or equal to about 1 wt % and less than about 25 wt %, or less than or equal to about 23 wt % or less than or equal to about 22 wt %, based on a total weight of the first nanoparticles, for example, as determined by thermogravimetric analysis.

The second base may include an inorganic base. The second base may include or may not include a tetramethylammonium moiety.

The first base may include a solution obtained by dissolving an inorganic base in a solvent (e.g., C1 to C10 alcohol). The second base may include a solution obtained by dissolving an inorganic base in a solvent (e.g., C1 to C10 alcohol).

The zinc precursor and the magnesium precursor may be added in a powder form.

The gallium precursor may include a gallium halide.

According to embodiments, an electroluminescent device capable of exhibiting improved life-span and electroluminescent characteristics at the same time is provided.

DETAILED DESCRIPTION

Figure 1:
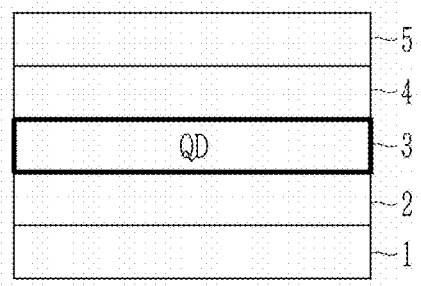
FIG. 1 is a schematic cross-sectional view of an electroluminescent device according to an embodiment.

Hereinafter, with reference to the accompanying drawings, various embodiments of the present disclosure will be described in detail so that those of ordinary skill in the art can best understand and more easily practice the present disclosure. The present disclosure may be embodied in many different forms and is not limited to the embodiments described herein.

In order to clearly explain the present disclosure, parts irrelevant to the description are omitted, and the same reference numerals are assigned to the same or similar elements throughout the specification. In the drawings, the thickness of layers, films, panels, regions, etc., are exaggerated for clarity. Like reference numerals designate like elements throughout the specification. The size and thickness of each constituent element as shown in the drawings are randomly indicated for better understanding and ease of description, and this disclosure is not necessarily limited to as shown. In the drawings, the thickness of layers, films, panels, regions, etc., are exaggerated for clarity. And in the drawings, for convenience of description, the thickness of some layers and regions are exaggerated.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion, and does not necessarily mean "above" in an opposite direction of gravity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. Therefore, the term "nanoparticle" such as a semiconductor nanoparticle or a zinc oxide nanoparticle may mean a single entity or a plurality of particles, and may refer to a singular particle or a plurality of particles. "At least one" is not to be construed as limiting "a" or "an." As used herein, "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, values of a work function or (HOMO or LUMO) energy levels are expressed as an absolute value from a vacuum level. In addition, a deep, a high, or large work function or energy level means that the absolute value is large when the vacuum level is set to "0 eV," and a shallow, low, or small work function or energy level means that the absolute value is small when the vacuum level is set to "0 eV."

As used herein, the average (value) may be mean or median. In an embodiment, the average (value) may be a mean average.

As used herein, the term "peak emission wavelength" is the wavelength at which a given emission spectrum of the light reaches its maximum.

As used herein, when a definition is not otherwise provided, "substituted" refers to replacement of at least one hydrogen of a compound or the corresponding moiety by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

In an embodiment, the hydrocarbon group may be a group containing carbon and hydrogen (e.g., an aliphatic group such as alkyl, alkenyl, or alkynyl group, or an aromatic group such as aryl group). The hydrocarbon group may be a group having a monovalence or multivalence formed by removal of one or more hydrogen atoms from alkane, alkene, alkyne, or arene. In the hydrocarbon group, at least one methylene may be replaced by an oxide moiety, a carbonyl moiety, an ester moiety, —NH—, or a combination thereof. Unless otherwise stated to the contrary, the hydrocarbon group (alkyl, alkenyl, alkynyl, or aryl) may have 1 to 60, 2 to 32, 3 to 24, or 4 to 12 carbon atoms.

As used herein, "alkyl" refers to a linear or branched saturated monovalent hydrocarbon group (methyl, ethyl hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

As used herein, "aryl" refers to a group formed by removal of at least one hydrogen from an aromatic hydrocarbon group (e.g., a phenyl or naphthyl group).

As used herein, "hetero" refers to one including 1 to 3 heteroatoms of N, O, S, Si, P, or a combination thereof.

As used herein, "alkoxy" means alkyl group linked via an oxygen (i.e., alkyl-O—), such as a methoxy, ethoxy, or sec-butyloxy group.

An "amine group" may be —NRR, wherein (R is each independently hydrogen, a C1 to C12 alkyl group, a C7 to C20 alkylaryl group, a C7 to C20 arylalkyl group, or a C6 to C18 aryl group).

Herein, the description that does not contain cadmium (or other toxic heavy metals) may refer to a concentration of cadmium (or a corresponding heavy metal) of less than or equal to about 100 ppm, less than or equal to about 50 ppm, less than or equal to about 10 ppm, or almost zero. In an embodiment, substantially no cadmium (or the toxic heavy metal) is present, or, if present, in an amount or impurity level below the detection limit of a given detection means.

Unless otherwise stated, numerical ranges stated herein are inclusive.

Unless otherwise stated, the words "substantially" or "approximately" or "about" are omitted before values in the numerical ranges specified herein.

As used herein, "substantially" or "approximately" or "about" means not only the stated value, but also the mean within an acceptable range of deviations, considering the errors associated with the corresponding measurement and the measurement of the measured value. For example, "substantially" or "approximately" can mean within ±10% or ±5% or within standard deviation of the stated value.

Herein, a nanostructure refers to a structure having a characteristic dimension or at least one region having a nanoscale dimension. In an embodiment, the dimension of the nanoparticle may be less than about 300 nm, less than about 250 nm, less than about 150 nm, less than about 100 nm, less than about 50 nm, or less than about 30 nm. These structures may have any shape. Unless otherwise specified herein, the nanoparticles or semiconductor nanoparticles may have any shape, such as nanowires, nanorods, nanotubes, multi-pod type shapes having two or more pods, nanodots (or quantum dots), etc. and are not particularly limited. The nanoparticles may be, for example, substantially crystalline, substantially monocrystalline, polycrystalline, amorphous, or a combination thereof.

For example, semiconductor nanoparticles such as quantum dots may exhibit quantum confinement or exciton confinement. In the present specification, the term "nanoparticles or quantum dots" are not limited in their shapes unless specifically defined. Semiconductor nanoparticles, such as quantum dots, may have a size smaller than a diameter of Bohr excitation in the bulk crystal of the same material, and may exhibit a quantum confinement effect. Quantum dots may emit light corresponding to their bandgap energy by controlling the size of the emission center of the nanocrystals.

Herein, T50 refers to time taken for luminance of a given device to decrease to 50% based on 100% of the initial luminance as the device is driven at a predetermined luminance.

Herein, T90 refers to time taken for luminance of a given device to decrease to 90% based on 100% of the initial luminance as the device is driven at a predetermined luminance.

Herein, external quantum efficiency (EQE) refers to a ratio of the number of photons emitted from a light emitting diode (LED) to the number of electrons passing through the device. EQE may be criteria of how efficiently the light emitting diode converts the electrons into the photons and allows them to escape. In an embodiment, EQE may be determined based on the following equation:

$$\text{EQE}=[\text{Injection efficiency}]\times[\text{Solid state quantum yield}]\times[\text{Extraction efficiency}]$$

Injection efficiency=proportion of electrons passing through the device that are injected into the active region;

Solid state quantum yield=proportion of all electron-hole recombinations in the active region that are radiative and thus, produce photons; and Extraction efficiency=proportion of photons generated in the active region that escape from the device.

Herein, the maximum external quantum efficiency refers to the maximum value of the external quantum efficiency.

Herein, the maximum luminance refers to a maximum value of luminance that the device can achieve.

Herein, quantum efficiency is a term used interchangeably with quantum yield. Quantum efficiency (or quantum yield) may be measured either in solution or in the solid state (in a composite). In an embodiment, quantum efficiency (or quantum yield) is the ratio of photons emitted to photons absorbed by the nanostructure or population thereof. In an embodiment, quantum efficiency may be measured by any method. For example, for fluorescence quantum yield or efficiency, there may be two methods: an absolute method and a relative method.

In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but the present disclosure is not limited thereto.

In this specification, a numerical endpoint or an upper or lower limit value (e.g., recited either as a "greater than or equal to value" "at least value" or a "less than or equal to value" or recited with "from" or "to") may be used to form a numerical range of a given feature.

An energy bandgap of a quantum dot may be changed according to a size, a structure, and/or a composition of nanocrystals. For example, as a size of a quantum dots increases, the semiconductor nanocrystal may have a narrower energy bandgap and emit light of an increased emission wavelength.

A semiconductor nanocrystal particle may have drawn attention as a light emitting material in a variety of fields such as a display device, an energy device, or a bio light emitting device.

A quantum dot light emitting device (hereinafter, also referred to as QD-LED) that emits light by application of a voltage includes semiconductor nanoparticles (e.g., quantum dots) as a light emitting material. QD-LED adopts a different emission principle from that of an organic light emitting diode (OLED) emitting light by using an organic material as an emission center but may realize purer colors (red, green, blue) and improved color reproducibility and accordingly, is being paid attention to as a next generation display device. QD-LED may be produced with a reduced cost by including a solution process and may be expected to realize increased stability because it is based on an inorganic material, but technology development for improving device properties and life-span characteristics is desired.

In an embodiment, a structure of the QD-LED includes a light emitting layer (EML) disposed between two electrodes (e.g., an anode and a cathode), and one or more auxiliary layers (e.g., a hole transport layer (HTL) and electron transport layer (ETL)) provided on opposite surfaces of the light emitting layer, and which provide charge balance and assist device driving. A QD-LED according to an embodiment may include an organic or inorganic hole auxiliary layer (e.g., organic or inorganic hole transport layer), for example, a p-type conductive organic material including poly(3,4-ethylenedioxythiophene) polystyrene sulfonate (PEDOT:PSS), poly(4-butylphenyl-diphenyl-amine) (TPD), poly(vinylcarbazole) (PVK), poly[(9,9-dioctylfluoren-2,7-diyl)-co-(4,4'-(N-(4-sec-butylphenyl))diphenylamine)] (TFB), or a combination thereof, or an inorganic hole transporter such as NiO or CuO.

Figure 4A:
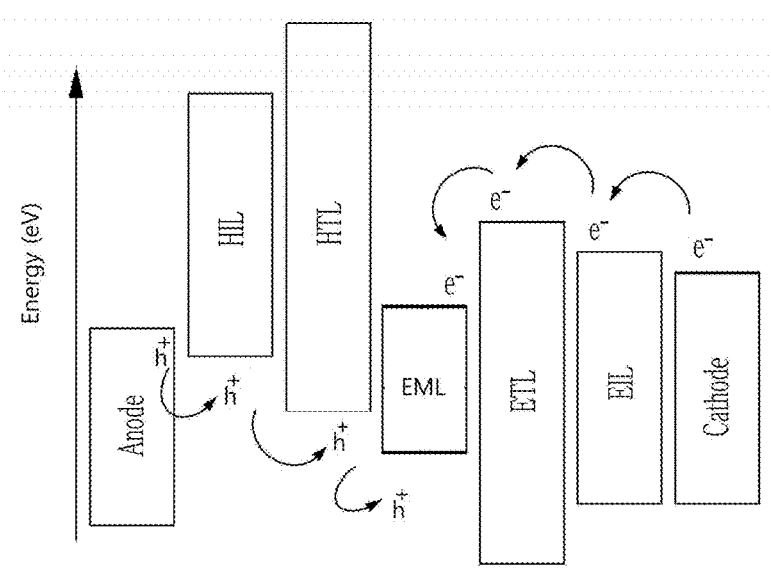
FIGS. 4A and 4B schematically show band alignment in an electroluminescent device according to an embodiment.
Figure 4B:
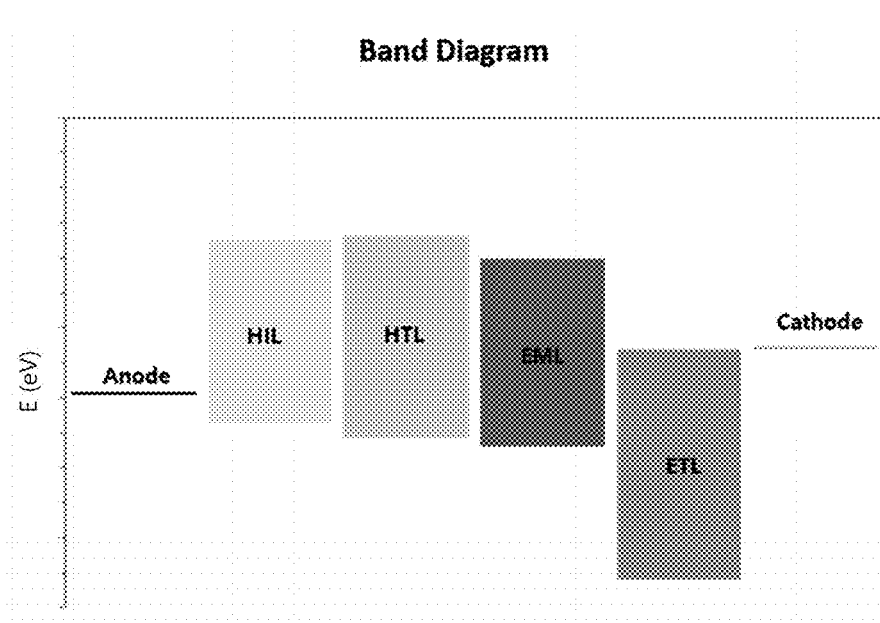

A QD-LED according to an embodiment may include an inorganic material (e.g., a zinc oxide) in an electron auxiliary layer such as an electron transport layer (ETL). In the QD-LED of an embodiment, an electron auxiliary layer containing the inorganic material on the quantum dot-based light emitting layer EML may be easily formed through a solution process, for example, a low-temperature process, and the electron auxiliary layer may provide improved mobility of electrons. Referring to FIG. 4A, a hole injected from the anode and an electron injected from the cathode may be supplied to the light emitting layer through the auxiliary layers and an exciton may be formed and light may be emitted therefrom.

In the light emitting layer, a quantum dot having a practically applicable level of an electroluminescent property may include a harmful heavy metal such as cadmium (Cd), lead, mercury, or a combination thereof. Accordingly, it is desirable to provide a light emitting device or a display device having a light emitting layer substantially free of the harmful heavy metal. In a QD-LED, currently reported and satisfactory electroluminescent properties are mostly based on a cadmium-based LED, and there is room for improvement in a QD-LED device using an environmentally-friendly quantum dot and for example emitting blue light that does not include cadmium or other harmful heavy metals.

The present inventors have found that an electron transporting layer (ETL) including ZnO nanoparticles in QD-LEDs may be matched relatively well with a cadmium-based quantum dot, exhibiting an increased property (e.g., an increased efficiency), but it may be quite difficult for the ETL including the zinc oxide nanoparticle to realize a satisfactory level of properties for example, in case of a ZnSe based quantum dot that is environmentally friendly and is designed to emit light in the blue region of the spectrum. Many technological efforts have been made for dealing with such issues, but improving the properties thereof is still desired for example in a commercial process. Without wishing to be bound by any theory, the zinc oxide-based nanoparticles disposed in the ETL may exhibit a charge transport property of the electron transport layer that is variable with a surface organic material, a surface defect, or a combination thereof. In the QD-LED device of an embodiment, the zinc oxide nanoparticles in the electron auxiliary layer have the features (e.g., a novel structure) described herein, achieving an improvement of the properties of the QD-LED.

An electroluminescent device according to an embodiment may be a self-luminescent type light emitting device configured to emit a desired light by applying a voltage with or without a separate irradiation light source.

In an embodiment, an electroluminescent device includes a first electrode 1 and a second electrode 5 spaced apart (e.g., each with a surface opposite the other); a light emitting layer 3 disposed between the first electrode and the second electrode and including a plurality of semiconductor nanoparticles; and an electron transport layer 4 between the light emitting layer 3 and the second electrode 5. The electroluminescent device may further include a hole auxiliary layer 2 disposed between the light emitting layer 3 and the first electrode 1. The hole auxiliary layer may include a hole transport layer (including, for example, an organic compound), a hole injection layer, or a combination thereof. See, FIG. 1.

Figure 2:
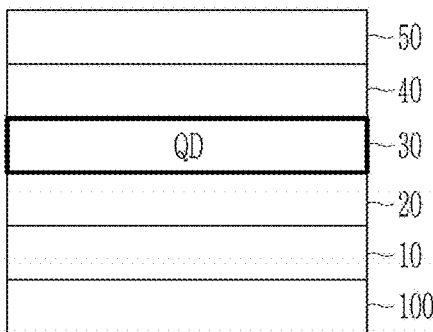
FIG. 2 is a schematic cross-sectional view of an electroluminescent device according to an embodiment.
Figure 3:
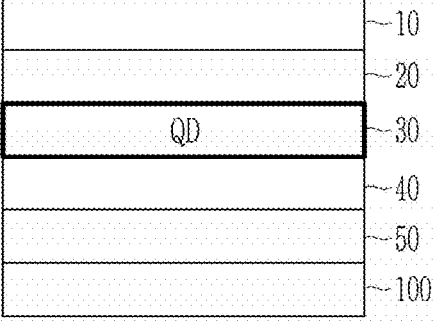
FIG. 3 is a schematic cross-sectional view of an electroluminescent device according to an embodiment.

The first electrode 1 or the second electrode 5 may include an anode or a cathode. In an embodiment, the first electrode may include a cathode (or anode) and the second electrode may include an anode (or cathode). In an embodiment, the second electrode includes a cathode. In the electroluminescent device, the first electrode or the second electrode may be disposed on a transparent substrate. Referring to FIGS. 2 and 3, the transparent substrate 100 may be a light extraction surface. The light emitting layer 3 or 30 may be disposed within a pixel in a display device described later.

Referring to FIGS. 2 and 3, the light emitting layer 30 may be disposed between the first electrode (e.g., anode) 10 and second electrode (e.g., cathode) 50. The second electrode or cathode 50 may include an electron injection conductor. The first electrode or anode 10 may include a hole injection conductor. The work functions of the electron/hole injection conductors included in the second electrode and the first electrode may be appropriately adjusted and are not particularly limited. For example, the second electrode may have a small work function and the first electrode may have a relatively large work function, or vice versa.

The electron/hole injection conductors may include a metal-based material (e.g., a metal, a metal compound, an alloy, or a combination thereof) (aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

At least one of the first electrode 10 and the second electrode 50 may be a light-transmitting electrode or a transparent electrode. In an embodiment, both the first electrode and the second electrode may be a light-transmitting electrode. The electrode(s) may be patterned. The first electrode 10 and/or the second electrode 50 may be disposed on a (e.g., insulating) substrate 100. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and for example, less than or equal to about 99%, or less than or equal to about 95%). The substrate may further include a region for a blue pixel, a region for a red pixel, a region for a green pixel, or a combination thereof. A thin film transistor may be disposed in each region of the substrate, and one of a source electrode and a drain electrode of the thin film transistor may be electrically connected to the first electrode or the second electrode.

The light-transmitting electrode may be disposed on a (e.g., insulating) transparent substrate. The substrate may be rigid or flexible. The substrate may be plastic, glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg:Ag, or the like, or a metal thin film of a single layer or a plurality of layers but is not limited thereto. In an embodiment, one of the first electrode or the second electrode may be an opaque electrode, the electrode may be made of an opaque conductor such as aluminum (Al), a lithium-aluminum (Li:Al) alloy, a magnesium-silver alloy (Mg:Ag), and lithium fluoride-aluminum (LiF:Al).

The thickness of the electrode (the first electrode and/or the second electrode) is not particularly limited and may be appropriately selected in consideration of device efficiency. For example, the thickness of the electrode may be greater than or equal to about 5 nm, for example, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 μm, for example, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

A light emitting layer 3 or 30 is disposed between the first electrode 1 and the second electrode 5 (e.g., the anode 10 and the cathode 50). The light emitting layer includes semiconductor nanoparticle(s) (e.g., blue light emitting nanoparticles, red light emitting nanoparticles, or green light emitting nanoparticles). The light emitting layer may include one or more (e.g., 2 or more or 3 or more and 10 or less) monolayers of a plurality of nanoparticles.

The light emitting layer may be patterned. In an embodiment, the patterned light emitting layer may include a blue light emitting layer (e.g., disposed within a blue pixel in a display device to be described later), a red light emitting layer (e.g., disposed within a red pixel in a display device to be described later), and a green light emitting layer (e.g., disposed within a green pixel in a display device to be described later), or a combination thereof. Each of the light emitting layers may be (e.g., optically) separated from an adjacent light emitting layer by a partition wall. In an embodiment, a partition wall such as a black matrix may be disposed between the red light emitting layer(s), the green light emitting layer(s), and the blue light emitting layer(s). In non-limiting embodiments, the red light emitting layer, the green light emitting layer, and the blue light emitting layer may each be isolated.

The light emitting layer or semiconductor nanoparticle(s) may not contain cadmium. The light emitting layer or semiconductor nanoparticle(s) may not contain mercury, lead, or a combination thereof.

In an embodiment, the semiconductor nanoparticles may have a core-shell structure. The semiconductor nanoparticles may include a core including a first semiconductor nanocrystal and a shell disposed on the core and including a second semiconductor nanocrystal and having a composition different from that of the first semiconductor nanocrystal.

The semiconductor nanoparticle (e.g., the first semiconductor nanocrystal and/or the second semiconductor nanocrystal) may include a Group II-VI compound, a Group III-V compound, a Group IV-VI compound, a Group IV element or compound, a Group compound, a Group I-II-IV-VI compound, or a combination thereof. The light emitting layer (or semiconductor nanoparticle, first semiconductor nanocrystal, or second semiconductor nanocrystal) may not contain harmful heavy metals such as cadmium, lead, mercury, or a combination thereof.

The Group II-VI compound may be a binary element compound selected from ZnS, ZnSe, ZnTe, ZnO, HgS, HgSe, HgTe, MgSe, MgS, and a mixture thereof; a ternary compound selected from ZnSeS, ZnSeTe, ZnSTe, HgSeS, HgSeTe, HgSTe, HgZnS, HgZnSe, HgZnTe, MgZnSe, MgZnS, and a mixture thereof; and a quaternary compound selected from HgZnTeS, HgZnSeS, HgZnSeTe, HgZnSTe, and a mixture thereof. The Group II-VI compound may further include a Group III metal.

The Group III-V compound may be a binary element compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II element. An example of such a semiconductor nanocrystal is InZnP.

The Group IV-VI compound may be a binary element compound selected from SnS, SnSe, SnTe, and a mixture thereof; a ternary compound selected from SnSeS, SnSeTe, SnSTe, and a mixture thereof; and a quaternary compound such as SnSSeTe.

Examples of the Group compound include CuInSe$_2$, CuInS$_2$, CuInGaSe, CuInGaS but are not limited thereto.

Examples of the group I-II-IV-VI compound include, but are not limited to, CuZnSnSe and CuZnSnS.

The Group IV element or compound is a single element selected from Si, Ge, and a mixture thereof; and a binary element compound selected from SiC, SiGe, and a mixture thereof.

In an embodiment, the first semiconductor nanocrystal may include a metal including indium, zinc, or a combination thereof and a non-metal including phosphorus, selenium, tellurium, sulfur, or a combination thereof. In an embodiment, the second semiconductor nanocrystal may include a metal including indium, zinc, or a combination thereof, and a non-metal including phosphorus, selenium, tellurium, sulfur, or a combination thereof.

In an embodiment, the first semiconductor nanocrystal may include InP, InZnP, ZnSe, ZnSeS, ZnSeTe, or a combination thereof and/or the second semiconductor nanocrystal may include ZnSe, ZnSeS, ZnS, ZnTeSe, or a combination thereof. In an embodiment, the shell may include zinc, sulfur, and optionally selenium in the outermost layer.

In an embodiment, the semiconductor nanoparticle may emit blue or green light and have a core including ZnSeTe, ZnSe, or a combination thereof and a shell including zinc chalcogenide (e.g., ZnS, ZnSe, and/or ZnSeS). An amount of sulfur in the shell may increase or decrease in the radial direction (from the core towards the surface).

In an embodiment, the semiconductor nanoparticle may emit red or green light, the core may include InP, InZnP, or a combination thereof, and the shell may include a Group 2 metal including zinc and a non-metal including at least one of sulfur and selenium. The semiconductor nanoparticle may include a first semiconductor nanocrystal containing zinc, selenium, and tellurium and a second semiconductor nanocrystal containing zinc chalcogenide and different from the first semiconductor nanocrystal.

The semiconductor nanoparticle may include a first semiconductor nanocrystal containing indium, phosphorus, and optionally zinc and a second semiconductor nanocrystal containing zinc chalcogenide and different from the first semiconductor nanocrystal. The semiconductor nanoparticle may include zinc chalcogenide, the zinc chalcogenide may include tellurium, and optionally the semiconductor nanoparticle may be configured to emit blue light. The semiconductor nanoparticle may include a core including the first semiconductor nanocrystal and a shell disposed on the core and including the second semiconductor nanocrystal.

In an embodiment, the semiconductor nanoparticle may have a core-shell structure, and an alloyed layer may be present or may not be present at the interface between the core and the shell. The alloyed layer may be a homogeneous alloy or may be a gradient alloy. In the gradient alloy, a concentration of elements present in the shell may have a concentration gradient that changes in the radial direction (e.g., decreases or increases toward the center).

In an embodiment, the shell may have a composition which is changed in a radial direction. In an embodiment, the shell may be a multilayered shell including two or more layers. In the multilayered shell, adjacent two layers may have different compositions from each other. In the multilayered shell, at least one layer may independently include a semiconductor nanocrystal having a single composition. In the multilayered shell, at least one layer may independently have an alloyed semiconductor nanocrystal. In the multilayered shell, at least one layer may have a concentration gradient that radially changes in terms of a composition of a semiconductor nanocrystal.

In the core-shell structured semiconductor nanoparticle, the bandgap energy of the shell material may be greater than that of the core material but is not limited thereto. The bandgap energy of the shell material may be smaller than that of the core material. In the case of the multilayered shell, the energy bandgap of the outermost layer material of the shell may be greater than those of the core and the inner layer material of the shell (layers that are closer to the core). In the case of the multilayered shell, a semiconductor nanocrystal of each layer is selected to have an appropriate bandgap, thereby effectively showing a quantum confinement effect.

The semiconductor nanoparticle of an embodiment may include, for example, an organic ligand, in a state in which they are bonded or coordinated to the surface. The organic ligand is as described herein.

In an embodiment, an absorption/emission wavelength of the semiconductor nanoparticle may be controlled by, for example, adjusting a composition and/or a size thereof. The semiconductor nanoparticle included in the light emitting layer 3 or 30 may be configured to emit light of a desired color. The semiconductor nanoparticle may include a blue light emitting semiconductor nanoparticle, a green light emitting semiconductor nanoparticle, or a red light emitting semiconductor nanoparticle.

A peak emission wavelength of the semiconductor nanoparticle (or the light emitting layer or the device including the same) may have a wavelength range of ultraviolet to infrared wavelengths or beyond it. For example, the peak emission wavelength may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The peak emission wavelength may be in the range of less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The peak emission wavelength of the semiconductor nanoparticle may be in the range of about 500 nm to about 650 nm.

The semiconductor nanoparticle (or the light emitting layer or the device including the same) may emit green light, and the peak emission wavelength may be in the range of greater than or equal to about 500 nm (e.g., greater than or equal to about 510 nm) and less than or equal to about 560 nm (e.g., less than or equal to about 540 nm). The semiconductor nanoparticle (or the light emitting layer or the device including the same) may emit red light, and the peak emission wavelength may be in the range of greater than or equal to about 600 nm (e.g., greater than or equal to about 610 nm) and less than or equal to about 650 nm (e.g., less than or equal to about 640 nm). The semiconductor nanoparticle (or the light emitting layer or the device including the same) may emit blue light, and the peak emission wavelength may be greater than or equal to about 440 nm (e.g., greater than or equal to about 450 nm) and less than or equal to about 480 nm (e.g., less than or equal to about 465 nm).

The semiconductor nanoparticle (or the light emitting layer or the device including the same) may exhibit a photoluminescence spectrum having a relatively narrow full width at half maximum. In an embodiment, the semiconductor nanoparticle (or the light emitting layer or the device including the same) may have a full width at half maximum of less than or equal to about 45 nm, for example less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm, in its photoluminescence spectrum.

The semiconductor nanoparticle (or the light emitting layer or the device including the same) may have (e.g., be configured to implement) a quantum yield of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The semiconductor nanoparticle may have a size or an average size (herein, simply referred to as "size") of greater than or equal to about 1 nm and less than or equal to about 100 nm. The size may be a particle diameter or an equivalent particle diameter calculated from a two-dimensional area confirmed by electron microscopy analysis in the case of non-spherical particles. In an embodiment, the semiconductor nanoparticle may have a size of about 1 nm to about 50 nm, for example, 2 nm (or 3 nm) to 35 nm. In an embodiment, the size of the semiconductor nanoparticle may be greater than or equal to about 1 nm, greater than or equal to about 2 nm, greater than or equal to about 3 nm, greater than or equal to about 4 nm, or greater than or equal to about 5 nm. In an embodiment, the size of the semiconductor nanoparticle may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The semiconductor nanoparticle may have any shape. In an embodiment, the shape of the semiconductor nanoparticle may be a sphere, a polyhedron, a pyramid, a multi-pod, a cube, a nanotube, a nanowire, a nanofiber, a nanosheet, a nanoplate, or a combination thereof.

The semiconductor nanoparticle may be synthesized by an proper method. For example, the semiconductor nanocrystal having a size of several nanometers may be synthesized through a wet chemical process. In the wet chemical process, a crystal particle may be grown by reacting precursor materials in an organic solvent, and growth of crystals may be controlled by coordinating the organic solvent or ligand compound on the surface of the semiconductor nanocrystals. The semiconductor nanocrystals may be recovered (separated) by pouring into an excess of nonsolvent to remove excess organic materials not coordinated on the surface and centrifuging the resulting mixture. Specific types of the nonsolvent include acetone, ethanol, methanol, and the like, but are not limited thereto.

In the display device or light emitting device, a thickness of a light emitting layer may be selected appropriately. In an embodiment, the light emitting layer may include a monolayer(s) of semiconductor nanoparticles. In another embodiment, the light emitting layer may include one or more, for example, two or more, three or more, or four or more and 20 or less, 10 or less, 9 or less, 8 or less, 7 or less, or 6 or less monolayers of semiconductor nanoparticles. The light emitting layer may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example about 10 nm to about 150 nm, for example about 20 nm to about 100 nm, for example about 30 nm to about 50 nm.

The forming of a light emitting layer may include obtaining a composition including a semiconductor nanoparticle (configured to emit light of a desired wavelength) and applying it onto a substrate or a charge auxiliary layer by an appropriate method (e.g., by a spin coating, an inkjet printing, etc.) or by depositing.

In an embodiment, the formed film of semiconductor nanoparticles may be further subjected to contact with a metal halide (e.g., zinc chloride) organic solution (e.g., an alcohol solution).

The forming of the light emitting layer including a semiconductor nanoparticle may include obtaining a composition including a semiconductor nanoparticle (configured to emit light of a desired wavelength) and applying it onto a substrate or a charge auxiliary layer by an appropriate method (e.g., by spin coating, inkjet printing, etc.) or by depositing. The forming of the light emitting layer may further include heat-treating the applied or deposited semiconductor nanoparticle layer. The heat treatment temperature is not particularly limited and may be appropriately selected in consideration of the boiling point of the organic solvent and the like. For example, the heat treatment temperature may be greater than or equal to about 60° C. The type of the organic solvent for the semiconductor nanoparticle dispersion is not particularly limited and may be appropriately selected. In an embodiment, the organic solvent may include an (substituted or unsubstituted) aliphatic hydrocarbon organic solvent, an (substituted or unsubstituted) aromatic hydrocarbon organic solvent, an acetate solvent, or a combination thereof.

The light emitting layer may have a single layer or a multilayered structure having two or more layers stacked. In the multilayer structure, adjacent layers (e.g., a first light emitting layer and a second light emitting layer) may be configured to emit the same color. In a multilayer structure, adjacent layers (e.g., a first light emitting layer and a second light emitting layer) may have the same or different compositions and/or the same or different ligands from each other. In an embodiment, the light emitting layer or the multilayer light emitting layer including two or more layers may have a halogen amount that changes in a thickness direction. In the (multilayer) light emitting layer according to an embodiment, the halogen amount may increase towards the electron auxiliary layer. In the (multilayer) light emitting layer according to an embodiment, the organic ligand amount may decrease towards the electron auxiliary layer. In the (multilayer) light emitting layer according to an embodiment, the halogen amount may decrease toward the electron auxiliary layer. In the (multilayer) light emitting layer according to an embodiment, the organic ligand amount may increase towards the electron auxiliary layer.

In an embodiment, a light emitting layer may include a light emitting layer of a first semiconductor nanoparticle having a surface substituted (e.g., ligand exchanged) with a halogen (e.g., chlorine) on the surface and a light emitting layer of a second semiconductor nanoparticle disposed the light emitting layer of the first semiconductor nanoparticle and having an increased organic ligand amount. A halogen (or chlorine) amount and/or an organic material amount of the light emitting layer may be controlled appropriately (e.g., via a post treatment for the formed layer). For example, a thin film of semiconductor nanoparticles having the organic ligand (e.g., a carboxylic acid group-containing ligand) may be treated with an alcohol solution of a metal halide (e.g., zinc halide or zinc chloride) to adjust (decrease) the organic ligand amount of the semiconductor nanoparticles in the thin film. This treated layer may have an increased halogen amount and exhibit a different solubility to an organic solvent than an untreated layer. Accordingly, a layer of a semiconductor nanoparticle having a different amount of an organic ligand (e.g., a layer of a halogen-treated semiconductor nanoparticle or a layer of a semiconductor nanoparticle having a carboxylic acid-containing ligand) may be subsequently formed on the treated light emitting layer.

In an embodiment, for example, a method of preparing a semiconductor nanoparticle having a core-shell structure may include: obtaining a core; preparing a first shell precursor solution including a first shell precursor containing a metal (e.g., zinc) and optionally an organic ligand; preparing a second shell precursor containing a non-metal element (e.g., sulfur, selenium, or a combination thereof); and heating the first shell precursor solution to a reaction temperature (e.g., greater than or equal to about 180° C., greater than or equal to about 200° C., greater than or equal to about 240° C., or greater than or equal to about 280° C. to less than or equal to about 360° C., less than or equal to about 340° C., or less than or equal to about 320° C.) and adding the core and the second shell precursor (e.g., once or more, or twice or more) to form a shell of a second semiconductor nanocrystal on the first semiconductor nanocrystal core. The method may further include separating the core from a reaction system used for its preparation and dispersing it in an organic solvent to prepare a core dispersion.

In an embodiment, for a shell formation, a solvent and optionally a ligand compound may be heated (or vacuum-treated) under vacuum to a predetermined temperature (e.g., 100° C. or higher), and thereafter, may be heated to a predetermined temperature (e.g., 100° C. or higher) after introducing nitrogen (inert atmosphere) into the reaction flask. Subsequently, the core may be added to the flask, and the shell precursors are sequentially or simultaneously added, and the reaction flask may be heated at a predetermined reaction temperature to conduct a reaction. One or more shell precursors may be sequentially introduced in different proportions of the mixture during the reaction time to provide a desired compositional gradient of the shell layer.

In the semiconductor nanoparticle of an embodiment, the core may be prepared by an appropriate method. The organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g. trioctylphosphine oxide) substituted with a (e.g., 1, 2, or 3) C6 to C22 alkyl group, a C12 to C22 aromatic ether such as phenyl ether or benzyl ether, or a combination thereof.

The organic ligand may coordinate the surfaces of the prepared semiconductor nanoparticles and allow the semiconductor nanoparticles to be well dispersed in the solution. The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $R_2POOH$, (wherein R and R' independently include C1 or more, C6 or more, or C10 or more and C40 or less, C35 or less, or C25 or less substituted or unsubstituted aliphatic hydrocarbon, or C6 to C40 substituted or unsubstituted aromatic hydrocarbon, or a combination thereof), or a combination thereof. The ligands may be used alone or as a mixture of two or more compounds.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, myristic acid, stearic acid, lauric acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine oxide compound thereof such as methyl phosphine oxide, ethyl phosphine oxide, propyl phosphine oxide, butyl phosphine oxide, pentyl phosphineoxide, tributylphosphineoxide, octylphosphine oxide, dioctyl phosphineoxide, trioctylphosphineoxide, and the like; diphenyl phosphine, triphenyl phosphine compound (DPP) or an oxide compound thereof; C5 to C20 alkyl phosphinic acid such as hexylphosphinic acid, octylphosphinic acid, dodecanephosphinic acid, tetradecanephosphinic acid, hexadecanephosphinic acid, octadecanephosphinic acid; C5 to C20 alkyl phosphonic acid; and the like, but is not limited thereof.

After completion of the reaction, a nonsolvent may be added to the reaction system to facilitate precipitation of the semiconductor nanoparticles, for example, nanoparticles coordinated with a ligand compound, and then separated, e.g., with a centrifuge. The nonsolvent may be a polar solvent that is miscible with the solvent used in the core formation and/or shell formation reactions and is not capable of dispersing the prepared nanocrystals. The nonsolvent may be selected depending on the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing non-solvents, or a combination thereof. The semiconductor nanocrystal particle may be separated by using centrifugation, sedimentation, chromatography, or distillation. The separated nanocrystals may be added to a washing solvent and washed, if needed. The washing solvent has no particular limit and may have a similar solubility parameter to that of the ligand and may, for example, include hexane, heptane, octane, chloroform, toluene, benzene, and the like.

The semiconductor nanoparticles may be non-dispersible or insoluble in water, the aforementioned nonsolvent, or a combination thereof. The semiconductor nanoparticles may be dispersed in the aforementioned organic solvent. In an embodiment, the aforementioned semiconductor nanoparticles may be dispersed in C6 to C40 aliphatic hydrocarbon, C6 to C40 substituted or unsubstituted aromatic hydrocarbon, or a combination thereof.

An electron auxiliary layer (e.g. electron transport layer) is disposed between the second electrode and the light emitting layer. The electron auxiliary layer may includes an electron transport layer. An electron injection layer may be disposed between the second electrode and the electron transport layer.

The electron transport layer includes a zinc oxide nanoparticle (for example, a plurality of zinc oxide nanoparticles). The zinc oxide nanoparticle further includes magnesium and gallium. The electron transport layer may be adjacent to the light emitting layer (e.g., disposed directly on the light emitting layer). In an embodiment, the electron transport layer may contact the light emitting layer.

In the zinc oxide nanoparticle, an amount of the gallium may be greater than or equal to about 1 mol % (i.e., greater than or equal to about 0.01:1 as a mole ratio of Ga:(Zn+Mg+Ga)) and less than or equal to about 30 mol % (i.e., less than or equal to about 0.3:1 as a mole ratio of Ga:(Zn+Mg+Ga)) based on a total amount of zinc, magnesium, and gallium. In the zinc oxide nanoparticle, a mole ratio of gallium to magnesium (Ga:Mg) may be less than or equal to about 3:1, or less than or equal to about 2.7:1. A mole ratio of gallium to magnesium may be greater than or equal to about 0.01:1.

The zinc oxide nanoparticle may further include an additional metal selected from an alkali metal, Ca, Zr, W, Li, Ti, Y, Al, or a combination thereof. The alkali metal may include lithium, sodium, potassium, rubidium, cesium, or a combination thereof. The zinc oxide nanoparticle may further include a halogen. The halogen may include chlorine, fluorine, bromine, iodine, or a combination thereof. The alkali metal may include potassium, cesium, rubidium, or a combination thereof, and the halogen may include chlorine.

In an embodiment, the zinc oxide nanoparticle may have a concentration gradient for magnesium and/or a concentration gradient for gallium. The concentration gradient for magnesium may increase or decrease from a center of the particle toward a surface thereof. The concentration gradient for gallium may increase or decrease from a center of the particle toward a surface thereof. In an embodiment, the zinc oxide nanoparticle may exhibit a higher concentration of magnesium in an inner portion of the particle than in an outer portion thereof. The zinc oxide nanoparticle may exhibit a higher concentration of gallium in an outer portion of the particle than in an inner portion of the particle. In an embodiment, the zinc oxide nanoparticle may have a core-shell structure. The zinc oxide nanoparticle or the core of the zinc oxide nanoparticle may include $Zn_{1-x}M_xO$ (where M is Mg and optionally includes Ca, Zr, W, Li, Ti, Y, Al, or a combination thereof, $0 \leq x \leq 0.5$). Herein, in the above formula, x may be greater than 0, greater than or equal to about 0.01, greater than or equal to about 0.03, greater than or equal to about 0.05, greater than or equal to about 0.07, greater than or equal to about 0.1, greater than or equal to about 0.13, greater than or equal to about 0.15, greater than or equal to about 0.17, greater than or equal to about 0.2, greater than or equal to about 0.23, or greater than or equal to about 0.25. The x may be less than or equal to about 0.47, less than or equal to about 0.45, less than or equal to about 0.43, less than or equal to about 0.4, less than or equal to about 0.37, less than or equal to about 0.35, or less than or equal to about 0.3.

An electron auxiliary layer based on the zinc oxide nanoparticle may provide an improved property for a cadmium-based QD-LED. However, the present inventors have found that despite the use of the electron auxiliary layer based on the zinc oxide nanoparticles, there may be a technological limit in improving both an electroluminescent property and life-span simultaneously, in case of an electroluminescent device including a cadmium-free semiconductor nanoparticle in a light emitting layer and configured to emit light of a desired wavelength (e.g., blue light) to. In a conventional art, zinc oxide-based nanoparticles may be prepared in a sol-gel method, and an additional metal may be introduced as a precursor into hydration condensation reactions of the sol-gel method. The present inventors have found that the zinc oxide-based nanoparticle of the conventional arts, for example, including an additional cation (e.g., magnesium, etc.), may include an organic material in an excessive amount on the surface for dispersibility of the particle, and the zinc oxide nanoparticle of the conventional art tends to have relatively high number of surface defects, which may have an adverse effect for use in an electron auxiliary layer.

Surprisingly, the present inventors have found that the zinc oxide nanoparticle prepared in a method described herein (e.g., synthesized by a process involving a phase transition and separation mechanism that occurs on an interface of liquid, solid, and solution phases) may exhibit a composition and/or a property (e.g., as described herein) different from a composition and/or a property of the zinc oxide particle of the conventional art, and as a result, an electron transport layer including the zinc oxide nanoparticle of an embodiment may contribute to improving an electroluminescent property and a life-span of a final light emitting device. According to an embodiment, the zinc oxide nanoparticle included in the electron transport layer may exhibit an organic material related feature, an energy level feature, and an electrical resistance feature that are suitable for an appropriately controlled light emitting semiconductor nanoparticle, and thus the electroluminescent device including the zinc oxide nanoparticle of an embodiment may exhibit both of an improved electroluminescent property and an improved life-span.

In an embodiment, in the zinc oxide nanoparticle or in the electron transport layer including the same, (e.g., as measured by inductively coupled plasma atomic emission spectroscopy (ICP-AES)), an amount of the gallium may be, based on (a total sum moles) of zinc, magnesium, and gallium, greater than or equal to about 1 mol %, greater than or equal to about 2 mol %, greater than or equal to about 3 mol %, greater than or equal to about 3.1 mol %, greater than or equal to about 3.3 mol %, greater than or equal to about 3.5 mol %, greater than or equal to about 3.7 mol %, greater than or equal to about 3.8 mol %, greater than or equal to about 3.9 mol %, greater than or equal to about 4 mol %, greater than or equal to about 4.1 mol %, greater than or equal to about 4.3 mol %, greater than or equal to about 4.5 mol %, greater than or equal to about 4.7 mol %, greater than or equal to about 4.8 mol %, greater than or equal to about 4.9 mol %, greater than or equal to about 5 mol %, greater than or equal to about 5.1 mol %, greater than or equal to about 5.3 mol %, greater than or equal to about 5.5 mol %, greater than or equal to about 5.7 mol %, greater than or equal to about 5.8 mol %, greater than or equal to about 5.9 mol %, greater than or equal to about 6 mol %, greater than or equal to about 6.1 mol %, greater than or equal to about 6.3 mol %, greater than or equal to about 6.5 mol %, greater than or equal to about 6.7 mol %, greater than or equal to about 6.8 mol %, greater than or equal to about 6.9 mol %, greater than or equal to about 7 mol %, greater than or equal to about 7.1 mol %, greater than or equal to about 7.3 mol %, greater than or equal to about 7.5 mol %, greater than or equal to about 7.7 mol %, greater than or equal to about 7.8 mol %, greater than or equal to about 7.9 mol %, greater than or equal to about 8 mol %, greater than or equal to about 8.1 mol %, greater than or equal to about 8.3 mol %, greater than or equal to about 8.5 mol %, greater than or equal to about 8.7 mol %, greater than or equal to about 8.8 mol %, greater than or equal to about 8.9 mol %, greater than or equal to about 9 mol %, greater than or equal to about 9.1 mol %, greater than or equal to about 9.3 mol %, greater than or equal to about 9.5 mol %, greater than or equal to about 9.7 mol %, greater than or equal to about 9.8 mol %, greater than or equal to about 9.9 mol %, greater than or equal to about 10 mol %, greater than or equal to about 10.1 mol %, greater than or equal to about 10.3 mol %, greater than or equal to about 10.5 mol %, greater than or equal to about 10.7 mol %, greater than or equal to about 10.8 mol %, greater than or equal to about 10.9 mol %, greater than or equal to about 11 mol %, greater than or equal to about 11.3 mol %, greater than or equal to about 11.5 mol %, greater than or equal to about 11.7 mol %, greater than or equal to about 12 mol %, greater than or equal to about 12.5 mol %, greater than or equal to about 13 mol %, greater than or equal to about 13.5 mol %, greater than or equal to about 14 mol %, greater than or equal to about 14.5 mol %, greater than or equal to about 15 mol %, greater than or equal to about 15.5 mol %, greater than or equal to about 16 mol %, greater than or equal to about 16.5 mol %, or greater than or equal to about 17 mol %.

The amount of gallium may be, based on (a sum total of moles) of zinc, magnesium, and gallium, less than or equal to about 30 mol %, less than or equal to about 27 mol %, less than or equal to about 25 mol %, less than or equal to about 24 mol %, less than or equal to about 23 mol %, less than or equal to about 22 mol %, less than or equal to about 21 mol %, less than or equal to about 20 mol %, less than or equal to about 19 mol %, less than or equal to about 18 mol %, less than or equal to about 17.5%, or less than or equal to about 17 mol %.

In the zinc oxide nanoparticle or in the electron transport layer including the same, a mole ratio of gallium to zinc (Ga:Zn) may be greater than or equal to about 0.04:1, greater than or equal to about 0.042:1, greater than or equal to about 0.044:1, greater than or equal to about 0.048:1, greater than or equal to about 0.05:1, greater than or equal to about 0.06:1, greater than or equal to about 0.07:1, greater than or equal to about 0.08:1, greater than or equal to about 0.085:1, greater than or equal to about 0.09:1, greater than or equal to about 0.1:1, greater than or equal to about 0.11:1, greater than or equal to about 0.112:1, greater than or equal to about 0.115:1, greater than or equal to about 0.12:1, greater than or equal to about 0.13:1, greater than or equal to about 0.15:1, greater than or equal to about 0.17:1, greater than or equal to about 0.18:1, greater than or equal to about 0.19:1, greater than or equal to about 0.2:1, greater than or equal to about 0.21:1, or greater than or equal to about 0.25:1.

In the zinc oxide nanoparticle or in the electron transport layer including the same, the mole ratio of gallium to zinc (Ga:Zn) may be less than or equal to about 0.7:1, less than or equal to about 0.5:1, less than or equal to about 0.4:1, less than or equal to about 0.35:1, less than or equal to about 0.3:1, less than or equal to about 0.25:1, less than or equal to about 0.23:1, less than or equal to about 0.21:1, less than or equal to about 0.2:1, less than or equal to about 0.16:1, or less than or equal to about 0.15:1.

In the zinc oxide nanoparticle or in the electron transport layer including the same, a mole ratio of magnesium to zinc (Mg:Zn) may be greater than or equal to about 0.035:1, greater than or equal to about 0.04:1, greater than or equal to about 0.045:1, greater than or equal to about 0.05:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, or greater than or equal to about 0.13:1.

In the zinc oxide nanoparticle or in the electron transport layer including the same, the mole ratio of magnesium to zinc (Mg:Zn) may be less than or equal to about 0.5:1, less than or equal to about 0.3:1, less than or equal to about 0.29:1, less than or equal to about 0.25:1, less than or equal to about 0.21:1, less than or equal to about 0.17:1, less than or equal to about 0.16:1, less than or equal to about 0.155:1, less than or equal to about 0.15:1, less than or equal to about 0.145:1, less than or equal to about 0.14:1, less than or equal to about 0.13:1, less than or equal to about 0.12:1, less than or equal to about 0.11:1, or less than or equal to about 0.1:1.

In the zinc oxide nanoparticle or in the electron transport layer including the same, a mole ratio of gallium to magnesium (Ga:Mg) may be greater than or equal to about 0.01:1, greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.32:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.95:1, greater than or equal to about 1:1, greater than or equal to about 1.3:1, greater than or equal to about 1.5:1, greater than or equal to about 1.7:1, greater than or equal to about 1.9:1, greater than or equal to about 2:1, or greater than or equal to about 2.1:1.

In the zinc oxide nanoparticle or in the electron transport layer including the same, the mole ratio of gallium to magnesium (Ga:Mg) may be less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.35:1, less than or equal to about 2.3:1, less than or equal to about 2.2:1, less than or equal to about 2.1:1, less than or equal to about 2:1, less than or equal to about 1.8:1, less than or equal to about 1.6:1, less than or equal to about 1.4:1, less than or equal to about 1.2:1, less than or equal to about 1.1:1, less than or equal to about 1:1, less than or equal to about 0.9:1, or less than or equal to about 0.85:1.

In the zinc oxide nanoparticle or in the electron transport layer including the same, a mole ratio of a total sum of magnesium and gallium to zinc [(Mg+Ga):Zn] may be greater than or equal to about 0.15:1, greater than or equal to about 0.155:1, greater than or equal to about 0.16:1, greater than or equal to about 0.165:1, greater than or equal to about 0.17:1, greater than or equal to about 0.175:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, or greater than or equal to about 0.35:1.

In the zinc oxide nanoparticle or in the electron transport layer including the same, the mole ratio of a total sum of magnesium and gallium to zinc [(Mg+Ga):Zn] may be less than or equal to about 0.7:1, less than or equal to about 0.6:1, less than or equal to about 0.5:1, less than or equal to about 0.45:1, less than or equal to about 0.4:1, less than or equal to about 0.35:1, less than or equal to about 0.33:1, less than or equal to about 0.31:1, less than or equal to about 0.29:1, less than or equal to about 0.26:1, less than or equal to about 0.23:1, or less than or equal to about 0.2:1.

In an embodiment, the zinc oxide particle or the electron transport layer including the same may further include a halogen (e.g., chlorine), and in the zinc oxide nanoparticle or the electron transport layer including the same, a mole ratio of halogen to gallium (halogen:gallium or Cl:Ga) may be, for example, as determined by X-ray photoelectron spectroscopy (XPS) analysis, greater than or equal to about 0.01:1, greater than or equal to about 0.03:1, greater than or equal to about 0.05:1, greater than or equal to about 0.07:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, or greater than or equal to about 0.17:1.

In the zinc oxide nanoparticle or the electron transport layer including the same, the mole ratio of halogen to gallium (halogen/gallium or Cl:Ga) may be, for example, as determined by X-ray photoelectron spectroscopy (XPS) analysis, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, or less than or equal to about 0.19:1. Without wishing to be bound by any theory, it is believed that the halogen included in the zinc oxide nanoparticle may provide an additional passivation and/or an enhanced organic coordination to the zinc oxide nanoparticles.

The present inventors have found that according to the prior art method, it may be difficult for the zinc oxide particle to include magnesium and gallium in the amount range described herein. Without wishing to be bound by any theory, it is believed that in the prior art method, if the zinc oxide particle further contains magnesium, a large amount of an organic substance may exist on a surface of the particle, and this may make it difficult for gallium to be introduced into the particles at a desired level. For example, a reaction involving a gallium precursor in the presence of a magnesium containing zinc oxide nanoparticle prepared by the conventional sol-gel method cannot achieve a zinc oxide nanoparticle that includes the gallium amount recited herein. Without wishing to be bound by any theory, it is believed that the sol-gel method of the conventional art may involve an intricate coordination reaction, a relatively slow nucleation, and a ligand-prohibited growth in a hydrolysis reaction, and controlling a crystallinity of the nanoparticle may become more difficult, and the trap states generated in the sol-gel method may be responsible for nonradiative recombination, inducing a strong phonon scattering and a photoluminescent (PL) quenching.

Unlike the conventional art based on the sol-gel hydration reaction, in the electroluminescent device of an embodiment, a magnesium-containing zinc oxide nanoparticle may be synthesized by a method involving a phase transition and separation mechanism (e.g., liquid-solid-solution synthesis, LSS synthesis) which occurs at the interface of liquid, solid, and solution phases present during the synthesis. Without wishing to be bound by any theory, it is believed that in case of the nanoparticles obtained by the method of an embodiment involving the LSS synthesis as described herein may have an improved (e.g., better) coordination effect of an acetate ligand in comparison with nanoparticles prepared in the conventional art (the sol gel method), and may exhibit an improved solubility in a first solvent (e.g., ETOH). Accordingly, in the method of an embodiment, the nanoparticle (e.g., the first nanoparticle) may include a relatively reduced amount of the ligand in comparison with a conventional nanoparticle of an identical size, and the first nanoparticle (e.g., a magnesium-containing zinc oxide nanoparticle) synthesized by the method of embodiment may react with a gallium precursor relatively readily under a reaction condition described herein, and the resulting zinc oxide nanoparticle may have the mole percent composition described herein.

In addition, in the electroluminescent device of an embodiment, the zinc oxide nanoparticle having the features described herein may provide a proper dispersibility (for example, desired for a solution process) but may include a relatively lower amount of an organic substance. In an embodiment, the zinc oxide nanoparticle may be dispersed in a C1 to C10 alcohol solvent. The zinc oxide nanoparticle may include, based on a total weight of the zinc oxide nanoparticles, an amount of an organic substance that is greater than or equal to about 1 weight percent (wt %), greater than or equal to about 3 wt %, greater than or equal to about 5 wt %, greater than or equal to about 7 wt %, greater than or equal to about 10 wt %, greater than or equal to about 15 wt %, greater than or equal to about 17 wt %, greater than or equal to about 19 wt %, or greater than or equal to about 20 wt % based on a total weight of the zinc oxide nanoparticles. In the zinc oxide particles, the amount of the organic material may be less than about 25 wt %, less than or equal to about 24.5 wt %, less than or equal to about 24 wt %, or less than or equal to about 23.5 wt %, for example, as determined by a thermogravimetric analysis.

In an embodiment, the zinc oxide nanoparticle may exhibit, as dispersed in an alcohol solvent and measured by a dynamic light scattering analysis, an average particle diameter (may be referred to as a DLS average particle diameter, as well) of greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, or greater than or equal to about 7.5 nm. The DLS average particle diameter of the zinc oxide nanoparticle may be less than or equal to about 9 nm, less than or equal to about 8.5 nm, less than or equal to about 8 nm, less than or equal to about 7.5 nm, or less than or equal to about 7 nm.

The zinc oxide nanoparticle may exhibit improved crystallinity. The zinc oxide nanoparticle may exhibit, in X-ray diffraction analysis, a full width at half maximum of a peak corresponding to a (100) crystal plane (herein, referred to as a first peak) that is greater than or equal to about 0.5 degrees, greater than or equal to about 0.8 degrees, greater than or equal to about 1 degree, or greater than or equal to about 1.2 degrees and less than or equal to about 8 degrees, less than or equal to about 5 degrees, less than or equal to about 3 degrees, less than or equal to about 1.8 degrees, less than or equal to about 1.5 degrees, or less than or equal to about 1.3 degrees. The full width at half maximum of the first peak may be less than or equal to about 2.8 degrees, less than or equal to about 2.7 degrees, less than or equal to about 2.6 degrees, less than or equal to about 2.5 degrees, less than or equal to about 2 degrees, less than or equal to about 1.5 degrees, or less than or equal to about 1.4 degrees.

The zinc oxide nanoparticle may exhibit, in X-ray diffraction analysis, a full width at half maximum of a peak corresponding to a (101) crystal plane (hereinafter, a second peak) that is greater than or equal to about 0.5 degrees, greater than or equal to about 0.8 degrees, greater than or equal to about 1 degree, or greater than or equal to about 1.2 degrees and less than or equal to about 8 degrees, less than or equal to about 5 degrees, less than or equal to about 3 degrees, less than or equal to about 1.8 degrees, or less than or equal to about 1.5 degrees. The full width at half maximum of the second peak may be less than or equal to about 3.5 degrees, less than or equal to about 3.4 degrees, less than or equal to about 3.2 degrees, less than or equal to about 3 degrees, less than or equal to about 2.8 degrees, less than or equal to about 2.5 degrees, or less than or equal to about 2.4 degrees.

The first peak may have (e.g., a maximum intensity present in) a 2-theta angle range of between about 30 degrees and about 35 degrees (e.g., from about 31 degrees to about 33 degrees, from about 31.03 degrees to about 32.78 degrees, from about 30.7 degrees to about 32.9 degrees, from about 30.5 degrees to about 31.8 degrees, or a combination thereof). The second peak may have (e.g., a maximum intensity present in) a 2-theta angle range of between about 34 degrees and about 40 degrees (e.g., about 34 degrees to about 37 degrees, from about 35.32 degrees to about 36.74 degrees, from about 34 degrees to about 34.5 degrees, from about 34.0 degrees to about 36.2 degrees, or a combination thereof).

In a photoluminescence spectrum obtained by the irradiation of light having a wavelength of 300 nm, the zinc oxide nanoparticle may exhibit an intensity ratio of a defective emission peak to a band-edge emission peak (defective emission:band-edge emission) that is less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1:1. The intensity ratio of a defective emission peak to a band-edge emission peak may be greater than or equal to about 0.1:1, greater than or equal to about 0.5:1, greater than or equal to about 0.9:1, or greater than or equal to about 1:1. A peak emission wavelength of the band-edge emission may be greater than or equal to about 350 nm, greater than or equal to about 360 nm, or greater than or equal to about 375 nm and less than or equal to about 400 nm, less than or equal to about 390 nm, or less than or equal to about 380 nm. A peak emission wavelength of the defect emission may be greater than or equal to about 450 nm, greater than or equal to about 460 nm, greater than or equal to about 470 nm, greater than or equal to about 480 nm, greater than or equal to about 490 nm, or greater than or equal to about 500 nm and less than or equal to about 550 nm, less than or equal to about 540 nm, less than or equal to about 530 nm, less than or equal to about 525 nm, less than or equal to about 520 nm, or less than or equal to about 510 nm.

In the UV-Vis absorption spectrum, the zinc oxide nanoparticle may exhibit a first absorption peak wavelength of less than or equal to about 320 nm, less than or equal to about 319 nm, less than or equal to about 318 nm, less than or equal to about 317 nm, less than or equal to about 316 nm, less than or equal to about 315 nm, less than or equal to about 314 nm, less than or equal to about 313 nm, less than or equal to about 312 nm, or less than or equal to about 311 nm. The first absorption peak wavelength may be greater than or equal to about 290 nm. The first absorption peak wavelength may be greater than or equal to about 295 nm, greater than or equal to about 300 nm, greater than or equal to about 301 nm, greater than or equal to about 302 nm, or greater than or equal to about 303 nm.

The zinc oxide nanoparticle may provide a controlled bandgap alignment for a light emitting layer (e.g., including a cadmium-free, blue light emitting semiconductor nanoparticle). The zinc oxide nanoparticle may exhibit a HOMO level of greater than or equal to about 7.21 eV, for example, greater than or equal to about 7.25 eV, greater than or equal to about 7.3 eV, greater than or equal to about 7.4 eV, or greater than or equal to about 7.45 eV. The HOMO level of the zinc oxide nanoparticle may be less than or equal to about 7.6 eV, less than or equal to about 7.55 eV, less than or equal to about 7.53 eV, or less than or equal to about 7.49 eV. The HOMO level may be determined in an appropriate manner, for example, via an Ultraviolet Photoelectron Spectroscopy (UPS) analysis, which is not limited thereto.

The zinc oxide nanoparticle may exhibit a LUMO level of greater than or equal to about 3.53 eV, greater than or equal to about 3.58 eV, greater than or equal to about 3.6 eV, greater than or equal to about 3.7 eV, or greater than or equal to about 3.75 eV. The LUMO level may be less than or equal to about 3.85 eV, less than or equal to about 3.8 eV, or less than or equal to about 3.79 eV. The LUMO level may be determined (calculated) from a bandgap energy and the HOMO. The bandgap energy may be determined by a UV-Vis absorption spectroscopy analysis.

In an embodiment, the zinc oxide nanoparticle may exhibit a bandgap energy of greater than or equal to about 3.61 eV, greater than or equal to about 3.62 eV, greater than or equal to about 3.63 eV, greater than or equal to about 3.64 eV, or greater than or equal to about 3.65 eV. The bandgap energy of the zinc oxide nanoparticle may be less than or equal to about 3.85 eV, less than or equal to about 3.8 eV, less than or equal to about 3.78 eV, less than or equal to about 3.77 eV, less than or equal to about 3.75 eV, or less than or equal to about 3.7 eV.

In an embodiment, the zinc oxide nanoparticle may have a size or an average size (hereinafter, simply referred to as "size") of greater than or equal to about 1 nm, greater than or equal to about 3 nm, greater than or equal to about 5 nm, or greater than or equal to about 7 nm. The zinc oxide nanoparticle may have a size of less than or equal to about 10 nm, for example, less than or equal to about 8 nm, less than or equal to about 7 nm, or less than or equal to about 6 nm.

In an embodiment, as operated with a predetermined initial luminance (e.g., an initial luminance of 650 nit), the electroluminescent device of an embodiment may exhibit a T50 that is greater than or equal to about 200 hours, greater than or equal to about 250 hours, greater than or equal to about 300 hours, greater than or equal to about 350 hours, greater than or equal to about 400 hours, greater than or equal to about 450 hours, greater than or equal to about 500 hours, greater than or equal to about 550 hours, greater than or equal to about 600 hours, greater than or equal to about 650 hours, or greater than or equal to about 700 hours. The T50 may be from about 275 hours to about 4000 hours, from about 330 hours to about 2000 hours, from about 350 hours to about 1500 hours, from about 420 hours to about 1000 hours, or from about 430 hours to about 900 hours.

In an embodiment, as operated with a predetermined initial luminance (e.g., an initial luminance of 650 nit), the electroluminescent device of an embodiment may exhibit a T90 that is greater than or equal to about 10 hours, greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, greater than or equal to about 90 hours, greater than or equal to about 100 hours, greater than or equal to about 110 hours, greater than or equal to about 120 hours, greater than or equal to about 130 hours, greater than or equal to about 140 hours, greater than or equal to about 150 hours, greater than or equal to about 160 hours, greater than or equal to about 170 hours, greater than or equal to about 180 hours, greater than or equal to about 190 hours, or greater than or equal to about 200 hours. As operated with a predetermined initial luminance (e.g., an initial luminance of 650 nit), the electroluminescent device of an embodiment may exhibit a T90 within a range of about 55 hours to about 1000 hours, about 62 hours to about 1000 hours, about 75 hours to about 800 hours, about 82 hours to about 700 hours, or a combination thereof.

In an embodiment, the zinc oxide nanoparticle may be prepared in a method described herein, unlike the sol gel-hydration method of the conventional art.

In an embodiment, the method of preparing the zinc oxide nanoparticle of an embodiment includes stirring a solvent mixture including a first solvent and a second solvent; adding a zinc precursor and a magnesium precursor to the solvent mixture and dissolving the precursors (e.g., the zinc precursor and the magnesium precursor) to obtain a first solution; adding a first base to the first solution and reacting them at a first temperature to form first nanoparticles including zinc magnesium oxide; isolating the formed first nanoparticles, and optionally, washing the first nanoparticles; dispersing the isolated first nanoparticles in a third solvent; and adding a gallium precursor and a second base to the third solvent; and reacting them (e.g., conducting a reaction involving the gallium precursor in the presence of the first nanoparticle) at a second temperature. In an embodiment, the dissolving of the zinc precursor and the magnesium precursor may include a heating of the solvent mixture including the precursors at a predetermined temperature.

The first solvent and the second solvent have a relative polarity difference of greater than or equal to about 0.3 and less than or equal to about 0.9. Without wishing to be bound by any theory, it is believed that in the method of an embodiment, a nanobubble (e.g., a solution bubble or a liquid bubble) may readily form in the solvent mixture of the first solvent and the second solvent due to the polarity difference between the first solvent and the second solvent, and a movement (e.g., a phase transfer and/or a phase separation) and a reaction of precursors (solid) may occur at an interface between the solvent mixture and the formed nanobubble to form an oxide nanoparticle including magnesium and zinc (e.g., a first nanoparticle).

Surprisingly, the present inventors have found that the first nanoparticle formed in this way may more readily react with a gallium precursor in comparison with a nanoparticle prepared in a conventional sol-gel method. As a result, a zinc oxide nanoparticle of an embodiment having a composition and/or a property described herein may be prepared. In addition, an electroluminescent device including the zinc oxide nanoparticle prepared according to the method of an embodiment may exhibit an improved electroluminescent property and an increased life-span described herein.

A difference between the relative polarities of the first solvent and the second solvent may be greater than or equal to about 0.35, greater than or equal to about 0.4, greater than or equal to about 0.45, greater than or equal to about 0.5, or greater than or equal to about 0.55. The difference between the relative polarities may be less than or equal to about 3, less than or equal to about 2, less than or equal to about 1, less than or equal to about 0.85, less than or equal to about 0.8, less than or equal to about 0.75, less than or equal to about 0.7, less than or equal to about 0.65, less than or equal to about 0.6, less than or equal to about 0.55, less than or equal to about 0.5, or less than or equal to about 0.45. The relative polarity of the solvents may be obtained from the literature (e.g., Solvents and solvent Effects in organic chemistry, Wiley VCH publisher, $3^{rd}$ edition, 2003). For example, water has a relative polarity of about 1.

The first solvent may include a C1 to C10 alcohol solvent, for example, methanol, ethanol, propanol, isopropanol, butanol, isobutanol, pentenol, isopentenol, or a combination thereof. The first solvent may have relative polarity of greater than or equal to about 0.4, greater than or equal to about 0.45, greater than or equal to about 0.5, greater than or equal to about 0.55, greater than or equal to about 0.6, greater than or equal to about 0.65, greater than or equal to about 0.7, or greater than or equal to about 0.75. The relative polarity of the first solvent may be less than or equal to about 2, less than or equal to about 1, or less than or equal to about 0.9.

The second solvent may include a C3 to C15 hydrocarbon solvent (aliphatic, aromatic, alicyclic, or hydrocarbon solvents including a hydrogenated benzene ring, for example, cyclohexane, hexane, heptane, nonane, octane, etc.). The second solvent may have a relative polarity of greater than or equal to about 0.001, greater than or equal to about 0.003, greater than or equal to about 0.006, greater than or equal to about 0.009, greater than or equal to about 0.01, or greater than or equal to about 0.012. The relative polarity of the second solvent may be less than or equal to about 4, less than or equal to about 3.5, less than or equal to about 3, less than or equal to about 2.5, less than or equal to about 2, less than or equal to about 1.5, less than or equal to about 1, less than or equal to about 0.5, less than or equal to about 0.1, less than or equal to about 0.05, or less than or equal to about 0.01.

The third solvent may include an alcohol solvent (e.g., methanol, ethanol, propanol, isopropanol, butanol, isobutanol, pentenol, isopentenol, or a combination thereof), a sulfoxide solvent (e.g., dimethylsulfoxide), a C3 to C15 hydrocarbon solvent (e.g., an aliphatic solvent, an aromatic, or an alicyclic solvent, for example, an alicyclic compound obtained by hydrogenation of aromatic hydrocarbons) or a combination thereof.

In an embodiment, the second solvent may form a nanobubble in the first solvent. In an embodiment, the first solvent may form a nanobubble in the second solvent. A volume ratio of the second solvent to the first solvent (second solvent:first solvent) may be from about 1:0.2 to about 1:5, from about 1:0.3 to about 1:3, from about 1:0.5 to about 1:2, from about 1:0.8 or about 1:1.25, from about 1:1 to about 1:1.5, or a combination thereof. In an embodiment, an amount of the first solvent may be greater than an amount of the second solvent. In an embodiment, an amount of the first solvent may be less than an amount of the second solvent.

The stirring of the solvent mixture may be performed at a speed of greater than or equal to about 100 rpm, greater than or equal to about 150 rpm, greater than or equal to about 200 rpm, greater than or equal to about 250 rpm, greater than or equal to about 300 rpm, greater than or equal to about 350 rpm, greater than or equal to about 400 rpm, greater than or equal to about 450 rpm, or greater than or equal to about 500 rpm. The stirring may be performed at a speed of less than or equal to about 800 rpm, less than or equal to about 700 rpm, or less than or equal to about 600 rpm.

The predetermined temperature may be greater than or equal to about 40° C., for example, greater than or equal to about 50° C., or greater than or equal to about 55° C. The predetermined temperature may be less than or equal to about a boiling point of the first solvent (or less than or equal to about a boiling point of the second solvent), less than or equal to about 78° C., less than or equal to about 70° C., less than or equal to about 65° C., or less than or equal to about 60° C.

In an embodiment, the first temperature may be lower than the predetermined temperature. The first temperature may be greater than or equal to about 25° C., greater than or equal to about 28° C., or greater than or equal to about 30° C. and less than or equal to about 80° C., less than or equal to about 70° C., less than or equal to about 60° C., less than or equal to about 55° C., less than or equal to about 50° C., or less than or equal to about 45° C.

The first nanoparticle formed form the reaction system may be separated by an appropriate method and optionally, be washed. For the separation and the optional washing, a nonsolvent may be added. The nonsolvent may include an ester-based solvent such as ethyl acetate. During the washing, an excessive amount of an organic material may be removed. The first nanoparticles obtained after the washing may include an organic material in an amount of greater than or equal to about 1 wt %, greater than or equal to about 10 wt %, greater than or equal to about 15 wt %, greater than or equal to about 18 wt %, or greater than or equal to about 21 wt %, and less than or equal to about and 25 wt %, less than or equal to about 24 wt %, less than or equal to about 23 wt %, less than or equal to about 22.5 wt %, less than or equal to about 22 wt %, or less than or equal to about 21.5 wt % based on a total weight of the first particles. Without wishing to be bound by any theory, it is believed that the first particle may include a smaller amount of an organic material than the particles prepared in the sol gel method and may participate the reaction involving a gallium precursor more readily.

The separated first nanoparticle may be dispersed in the third solvent, and the gallium precursor and the second base are added to the third solvent and then, optionally, heated. Surprisingly, the present inventors have found that the first nanoparticle more readily participates in a reaction involving the gallium precursor than an oxide particle formed in a conventional sol gel hydration method under the presence of the base. The resulting zinc oxide nanoparticle prepared by the method of an embodiment may exhibit the features described herein, indicating that the resulting nanoparticle may have a different internal structure from the oxide nanoparticle formed in the conventional sol gel hydration method. In addition, the resulting zinc oxide nanoparticle of an embodiment may be applied to an inorganic electron transport layer ETL, whereby contributing to an improvement of both of an electroluminescent property and a life-span of a device. Without wishing to be bound by any theory, it is believed that in the ETL including the zinc oxide nanoparticle of an embodiment, a hole leak may be controlled better, for example, through a trap passivation of the particle.

In the method of an embodiment, the zinc precursor, the magnesium, precursor, and the gallium precursor may be appropriately selected. The zinc precursor and/or the magnesium precursor may be added in a powder state. The zinc precursor and/or the magnesium precursor may include an acetate moiety. The zinc precursor may include zinc acetate, zinc acetylacetonate, zinc carboxylate, a zinc halide, zinc nitride, zinc oxide, or a combination thereof. The magnesium precursor may include magnesium acetate, magnesium acetylacetonate, magnesium carboxylate, a magnesium halide, magnesium nitride, magnesium oxide, or a combination thereof. The gallium precursor may include gallium acetate, gallium acetylacetonate, gallium carboxylate, a gallium halide, gallium nitride, gallium oxide, or a combination thereof. The halide for the zinc halide, the magnesium halide, or the gallium halide may include a chloride, a fluoride, a bromide, or an iodide.

The first base and the second base, each independently, may include an organic base such as an organic amine, an inorganic base, or a combination thereof. The inorganic base may include an alkali metal hydroxide such as KOH and NaOH, an alkaline earth metal hydroxide such as $Ca(OH)_2$, an inorganic ammonium compound, or a combination thereof. The organic base may include a primary amine, a secondary amine, a tertiary amine, an organic ammonium salt compound, or a combination thereof. The first or second base may include or may not include a tetraalkylammonium hydroxide (e.g., tetramethylammonium hydroxide). The base may be added by being dissolved in an alcohol solvent such as ethanol.

In the method of an embodiment, amounts and/or concentrations of the precursors may be controlled considering a desired composition of the zinc oxide nanoparticle.

As described above, the zinc oxide nanoparticle prepared in the method of an embodiment may include a reduced amount of an organic material but may exhibit a desired level of dispersibility, as well. In the method of an embodiment, the addition of the gallium precursor may increase an amount of the gallium relatively readily (for example, to an amount range as described herein. In the method of an embodiment, with an increase of the gallium amount, a first absorption peak wavelength of the zinc oxide nanoparticle may become less (e.g., may be shifted to a shorter wavelength) in the UV-Vis absorption spectrum of the zinc oxide nanoparticle. In the method, a size of the zinc oxide nanoparticles after reacting with the gallium precursor may be different from (e.g., may be treater than) the first nanoparticle, and a HOMO level of the zinc oxide nanoparticle may be different from the first particle. Without wishing to be bound by any theory, it is believed that the reaction involving the gallium precursor may be considered to include a cation exchange reaction with a metal ion (e.g., a zinc and/or magnesium ion) present in the first nanoparticle (or on the surface), but is not limited thereto.

In an embodiment, the electron transport layer may be provided through a solution process. In an embodiment, the electron transport layer may be formed by dispersing the zinc oxide nanoparticle in an organic solvent (e.g., a polar organic solvent, a non-polar organic solvent, or a combination thereof) to obtain a dispersion for forming an electron transport layer and applying the dispersion to form a film. in an embodiment, the dispersion for forming an electron transport layer may be applied on the light emitting layer. The solution process may further include removing the organic solvent form the formed film (e.g., through evaporation, etc.).

The formed electron transport layer may be post-treated with an organic acid compound. The organic acid compound may include $RCOOH$, $RSO_2H$, $RSO_3H$, $ArOH$, $ArSH$, $RCH=NOH$, $RCH=C(OH)R'$, $RCONHCOR'$, $ArSO_2NH_2$, $ArSO_2NHR$, $RCH_2NO_2$, $R_2CHNO_2$ (wherein, R and R' are the same or different and each independently, hydrogen, a substituted or non-substituted C1 to C24 aliphatic hydrocarbon group, a C3 to C40 alicyclic hydrocarbon group, or a combination thereof, but at least one R is not hydrogen, and Ar is a substituted or non-substituted C6 to C20 aromatic hydrocarbon group, or a combination thereof). The organic acid compound may include citric acid, acetic acid, oxalic acid, sulfonic acid, or a combination thereof.

In an embodiment, a thickness of the electron transport layer may be may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

In an embodiment, an electron injection layer may be further disposed between the electron transport layer and the second electrode. The material of the electron injection layer is not particularly limited and can be selected appropriately.

The light emitting device according to an embodiment may further include a hole auxiliary layer. Referring to FIG. 1, the hole auxiliary layer 2 is disposed between the first electrode 1 and the light emitting layer 3. The hole auxiliary layer 2 may include a hole injection layer, a hole transport layer, and/or an electron blocking layer. The hole auxiliary layer 2 may be a layer of a single component or a multilayer structure in which adjacent layers include different components.

The hole auxiliary layer 2 may have a HOMO energy level that can be matched with the HOMO energy level of the light emitting layer 3 in order to enhance mobility of holes transferred from the hole auxiliary layer 2 to the light emitting layer 3. In an embodiment, the hole auxiliary layer 2 may include a hole injection layer close to the first electrode 1 and a hole transport layer close to the light emitting layer 3.

The material included in the hole auxiliary layer 2 (e.g., a hole transport layer, a hole injection layer, or an electron blocking layer) is not particularly limited, and may include at least one selected from, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedi- oxy-thiophene):polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino] biphenyl (α-NPD), m-MTDATA (4,4',4"-Tris[phenyl(m-tolyl)amino]triphenylamine), 4,4',4"-tris(N-carbazolyl)-triphenylamine (TCTA), 1,1-bis[(di-4-toylamino)phenylcyclohexane (TAPC), a p-type metal oxide (e.g., $NiO$, $WO_3$, $MoO_3$, etc.), a carbon-based material such as graphene oxide, and a combinations thereof, but is not limited thereto.

In the hole auxiliary layer(s), the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, for example, less than or equal to about 40 nm, less than or equal to about 35 nm, or less than or equal to about 30 nm, but is not limited thereto.

A device according to an embodiment may have a normal structure. In an embodiment, and referring to FIG. 2, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS and/or p-type metal oxide and/or a hole transport layer such as TFB and/or PVK) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the cathode 50.

A device according to another embodiment may have an inverted structure. Herein, the second electrode 50 disposed on the transparent substrate 100 may include a metal oxide-based transparent electrode (e.g., ITO), and the anode 10 facing the cathode 50 may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. $MoO_3$ or other p-type metal oxide may be disposed as a hole auxiliary layer 20 (e.g., a hole transport layer including TFB and/or PVK and/or a hole injection layer including $MoO_3$ or other p-type metal oxide) between the metal anode 10 and the light emitting layer 30. (See FIG. 3)

The above device may be produced by an appropriate method. For example, the electroluminescent device may be produced by optionally forming a hole auxiliary layer (e.g., by deposition or coating) on a substrate on which an electrode is formed, forming a light emitting layer including semiconductor nanoparticles (e.g., a pattern of the afore-mentioned semiconductor nanoparticles), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited.

An electroluminescent device of an embodiment may exhibit an improved level of electroluminescent properties (e.g., along with an extended life-span as described above).

The electroluminescent device of an embodiment may exhibit a maximum external quantum efficiency (EQE) of greater than or equal to about 5%, greater than or equal to about 5.5%, greater than or equal to about 6%, greater than or equal to about 6.5%, greater than or equal to about 7%, greater than or equal to about 7.5%, greater than or equal to about 7.7%, greater than or equal to about 8%, greater than or equal to about 8.5%, greater than or equal to about 9%, greater than or equal to about 9.5%, greater than or equal to about 10%, greater than or equal to about 10.5%, greater than or equal to about 11%, greater than or equal to about 11.5%, greater than or equal to about 12%, greater than or equal to about 12.5%, greater than or equal to about 13%, greater than or equal to about 13.5%, or greater than or equal to about 14%.

The electroluminescent device of an embodiment may exhibit a maximum external quantum efficiency (EQE) of less than or equal to about 100%, less than or equal to about 90%, less than or equal to about 80%, less than or equal to about 70%, less than or equal to about 60%, less than or equal to about 50%, less than or equal to about 40%, less than or equal to about 30%, or less than or equal to about 20%.

The electroluminescent device of an embodiment may have a maximum luminance of greater than or equal to about 50,000 candela per square meter ($cd/m^2$), greater than or equal to about 60,000 $cd/m^2$, greater than or equal to about 70,000 $cd/m^2$, greater than or equal to about 80,000 $cd/m^2$, greater than or equal to about 90,000 $cd/m^2$, greater than or equal to about 100,000 $cd/m^2$, greater than or equal to about 150,000 $cd/m^2$, greater than or equal to about 200,000 $cd/m^2$, greater than or equal to about 250,000 $cd/m^2$, greater than or equal to about 300,000 $cd/m^2$, greater than or equal to about 310,000 $cd/m^2$, greater than or equal to about 320,000 $cd/m^2$, greater than or equal to about 330,000

$cd/m^2$, greater than or equal to about 340,000 $cd/m^2$, greater than or equal to about 350,000 $cd/m^2$, greater than or equal to about 360,000 $cd/m^2$, greater than or equal to about 370,000 $cd/m^2$, greater than or equal to about 380,000 $cd/m^2$, greater than or equal to about 390,000 $cd/m^2$, greater than or equal to about 400,000 $cd/m^2$, greater than or equal to about 440,000 $cd/m^2$, greater than or equal to about 500,000 $cd/m^2$, or greater than or equal to about 550,000 $cd/m^2$. The electroluminescent device of an embodiment may exhibit a maximum luminance of less than or equal to about 1,000,000 $cd/m^2$, or less than or equal to about 600,000 $cd/m^2$.

Another embodiment relates to a display device including the aforementioned electroluminescent device.

The display device may include a first pixel and a second pixel configured to emit light of a color differing from that of the first pixel. In the first pixel, the second pixel, or a combination thereof, the electroluminescent device according to an embodiment may be disposed. In an embodiment, the display device may further include a blue pixel, a red pixel, a green pixel, or a combination thereof. In the display device, the red pixel may include a red light emitting layer including a plurality of red light emitting semiconductor nanoparticles, the green pixel may include a green light emitting layer including a plurality of green light emitting semiconductor nanoparticles, and the blue pixel may include a blue light emitting layer including a plurality of blue light emitting semiconductor nanoparticles.

The display device may include a VR device, an AR device, a portable terminal device, a monitor, a laptop, a television, an electric sign board, a camera, or an electronic component for a vehicle.

Hereinafter, specific examples are illustrated. However, these examples are exemplary, and the present disclosure is not limited thereto.

EXAMPLES

Analysis Methods
[1] Electroluminescence Spectroscopic Analysis

A current according to a voltage is measured with a Keithley 2635B source meter, while the voltage is applied, and a CS2000 spectrometer is used to measure EL properties (e.g., luminance and EQE).
[2] Life-Span Characteristics T90 (h): As being driven with a predetermined initial luminance (e.g., 650 nit), time (hr) taken for the luminance to reach 90% based on 100% of the initial luminance is measured.

T50 (h): As being driven a predetermined initial luminance (e.g., 650 nit), time (hr) taken for the luminance to reach 50% based on 100% of the initial luminance is measured.
[3] XPS Analysis XPS analysis is performed using X-ray photoelectron spectrometer (manufacturer: Physical Electronics, model name: Quantum2000).
[4] ICP-AES Analysis Inductively coupled plasma atomic emission spectroscopy (ICP-AES) is performed using a Shimadzu ICPS-8100.
[5] TEM Analysis A transmission electron microscopic analysis of the pre-pared nanoparticles is performed by using an UT F30 Tecnai electron microscope.
[6] Photoluminescence Analysis Photoluminescence (PL) analysis is performed by using a Hitachi F-7100 spectrophotometer.

[7] UV-Vis Spectroscopy

Perform UV spectroscopic analysis using a Shimadzu UV-2600 spectrometer and obtain a UV-Visible absorption spectrum. The bandgap can be obtained from the X-intercept value of the UV-Visible absorption spectrum.

[8] Ultraviolet Photoelectron Spectroscopy (UPS) Analysis

UPS analysis is performed using Versaprobe PHIS000, and HOMO level values are obtained from work function and valence band offset values.

[9] TGA Analysis

TGA analysis is performed under $N_2$ atmosphere using a Trios V3.2 system (TA Instruments) at a heating rate of 10° C./min from 20° C. to 600° C.

[10] XRD Analysis

An XRD pattern for the nanoparticle is obtained by using a D8 Advance (Bruker) instrument using a Cu Kα source.

The following synthesis is performed under an inert gas atmosphere (under nitrogen or nitrogen flowing conditions), unless otherwise specified. A precursor amount is a molar amount, unless otherwise specified.

Synthesis Example 1

Selenium (Se), Sulfur(S), and tellurium (Te) are dispersed in trioctylphosphine (TOP), obtaining a 2M Se/TOP stock solution, a 1M S/TOP solution, and a 0.1M Te/TOP stock solution, respectively. To a reactor containing trioctylamine, 0.125 mmol of zinc acetate with oleylamine and oleic acid is added and then, heated to 120° C. under vacuum. After 1 hour, nitrogen is introduced into the reactor.

After heating the reactor to 300° C., the prepared Se/TOP stock solution and Te/TOP stock solution in a Te:Se mole ratio of 1:15 are rapidly injected together into the reactor with diphenylphosphine. When the reaction is complete, the reaction mixture rapidly cooled to room temperature, and acetone is added to facilitate formation of a precipitate. The mixture (suspension) is centrifuged to separate the solids, and then the solids are dispersed in toluene, obtaining a ZnSeTe core (dispersion in toluene).

To a flask containing trioctylamine, 1.8 mmoL of zinc acetate with oleic acid is added and the contents vacuum-treated at 120° C. for 10 minutes. Nitrogen is introduced into the flask and the flask heated to 220° C. Subsequently, the obtained ZnTeSe core is added to the flask, and the stock solutions Se/TOP and S/TOP are then injected. The reaction temperature is set at 280° C. or so. Optionally, additional precursors may be injected at the reaction temperature. Upon completion of the reaction, the reactor is cooled, ethanol is added, and resulting nanocrystals are separated by centrifuge and dispersed in toluene, obtaining blue light-emitting semiconductor nanoparticles.

Through a photoluminescence analysis, the semiconductor nanoparticles exhibit a peak emission wavelength of 455 nm.

Reference Example 1: Synthesis of First Nanoparticle (Via LSS Synthesis)

A mixed solvent prepared by mixing ethanol (relative polarity: 0.654) and cyclohexane (relative polarity: 0.006) in a (volume) ratio of 1:1 is added to a flask and stirred. Subsequently, zinc acetate dihydrate (powder) and magnesium acetate tetrahydrate (powder) are added to the flask and dissolved therein, by heating the same to 55° C. under a nitrogen atmosphere, and a 0.4 M potassium hydroxide ethanol solution is added to the flask. The mixture is stirred at 30° C. for 60 minutes. Ethyl acetate is added to the reaction solution to facilitate precipitation, and the precipitate is separated with a centrifuge. The obtained particles are washed with ethyl acetate at least twice to obtain $Zn_{1-x}Mg_xO$ nanoparticles (LSS nanoparticles) (x=0.15). The obtained nanoparticles (i.e., the first nanoparticles) are re-dispersed in ethanol and subjected to a transmission electron microscopic analysis. The nanoparticles have an average size of about 3 nm.

The obtained nanoparticles are subjected to an ICP-AES analysis, and the gallium mole percentage is found to be zero. The obtained nanoparticles are dispersed in ethanol and subjected to a dynamic light scattering (DLS) analysis, and the results are shown in Table 1. The obtained nanoparticles are subjected to a UV-Vis absorption spectroscopy analysis, a photoluminescence spectroscopy analysis, an X-ray diffraction analysis, and the results are shown in Table 3 and FIGS. 5 and 6. An XPS analysis is conducted for the obtained nanoparticles and the results confirm that no peak for chlorine (Cl2p) appears.

As a result of measuring an amount of an organic material by performing TGA analysis, it is confirmed that the amount of an organic material is 21.3%.

Reference Example 2

Zinc acetate dihydrate and magnesium acetate tetrahydrate are placed in a reactor containing dimethyl sulfoxide and heated to 60° C. under a nitrogen atmosphere. Subsequently, an ethanol solution of tetramethylammonium hydroxide pentahydrate is added to the reactor. After 1 hour with stirring, a precipitate forms, and is then separated with a centrifuge and dispersed in ethanol to obtain $Zn_{1-x}Mg_xO$ nanoparticles (x=0.15). A transmission electron microscopic analysis of the nanoparticles is performed. The particles have an average size of about 3 nm. The amount of an organic material by performing TGA analysis is confirmed as being greater than 25%.

Preparation Example 1

The first nanoparticles synthesized in Reference Example 1 are added to a flask with ethanol and maintained at 30° C. A gallium precursor solution having a concentration of 0.025M is prepared by dissolving gallium chloride in ethanol and adding the solution to the flask. A 0.4 M potassium hydroxide ethanol solution is added to the flask. The reaction mixture is stirred for 60 minutes. An amount of gallium used is 5 mol % based on an amount of zinc used to prepare the first nanoparticles. After the reaction is complete, ethyl acetate (EA) is added to promote precipitation, and the nanoparticles are separated by centrifuge and washed two or more washed with ethyl acetate, obtaining zinc oxide nanoparticles.

The obtained zinc oxide nanoparticles are subjected to an ICP-AES analysis, and some of the results are shown in Table 2. Mole ratios of Ga:Zn and Mg:Zn are about 0.04:1 and about 0.14:1, respectively. The obtained zinc oxide nanoparticles are dispersed in ethanol and subjected to a dynamic optical scattering (DLS) analysis, and the results are shown in Table 1.

Figure 5:
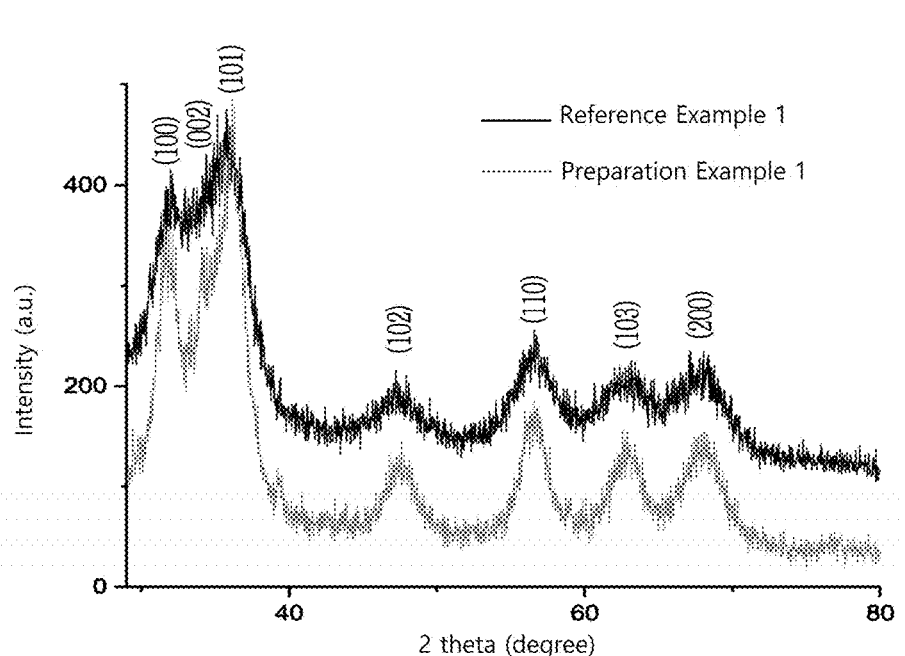
FIG. 5 shows XRD of zinc oxide nanoparticles prepared in Preparation Example 1 and Reference Example 1.
Figure 6:
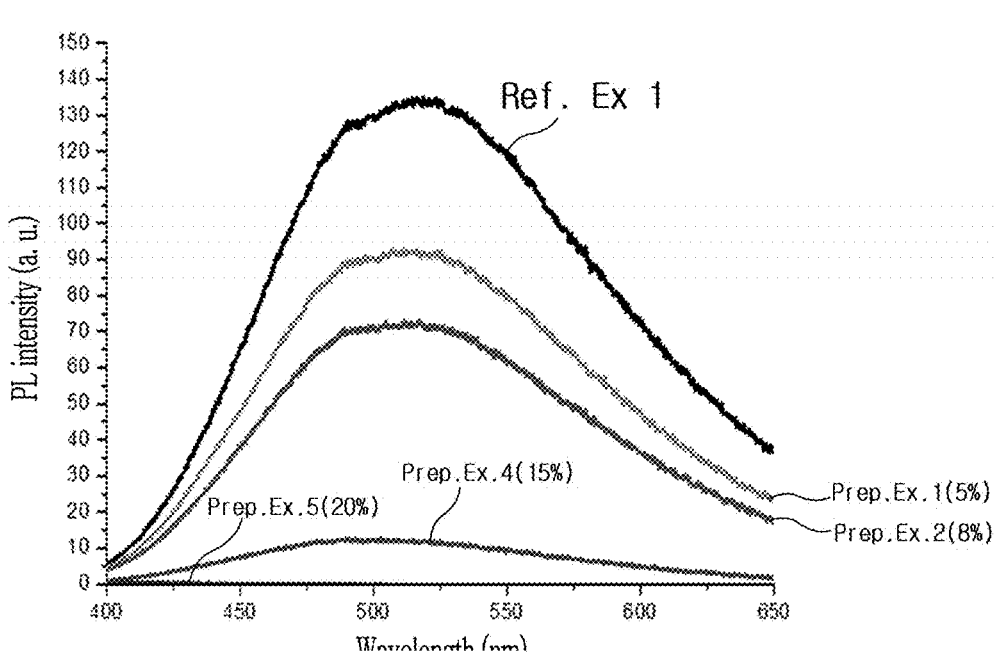
FIG. 6 shows photoluminescence analysis results (defect emission peak) of the zinc oxide nanoparticles prepared in Preparation Examples 1, 2, 4, and 5 and Reference Example 1.

For the obtained nanoparticles, a UV-Vis absorption spectroscopy analysis, a photoluminescence spectroscopy analysis, an X-ray diffraction analysis, an XPS analysis, and an UPS analysis are conducted and the results are shown in Tables 1 and 3 and FIGS. 5 and 6.

An amount of an organic material by performing TGA analysis is confirmed to be 22.3%.

Preparation Example 2

Zinc oxide nanoparticles are prepared in the same manner as in Preparation Example 1 except that the amount of gallium is changed into 8 mol %. The obtained zinc oxide nanoparticles are subjected to an ICP-AES analysis, a dynamic light scattering analysis, an UV-Vis absorption spectroscopy analysis, a photoluminescence spectroscopy analysis, an XPS analysis, and an UPS analysis, and the results are shown in Tables 1 to 3 and FIG. 6. Mole ratios of Ga:Zn and Mg:Zn are about 0.09:1 and about 0.14:1, respectively.

Figure 8:
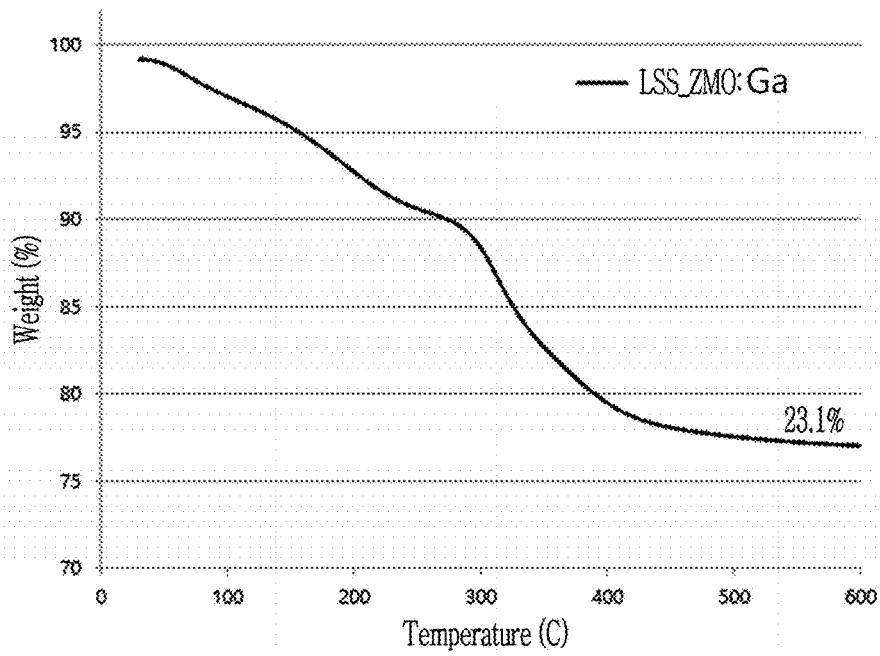
FIG. 8 shows the TGA results of the zinc oxide nanoparticles prepared in Preparation Example 2.

A TGA analysis is performed, and the results are shown in FIG. 8. Referring to FIG. 8, an amount of an organic material is confirmed to be 23.1%.

Preparation Example 3

Zinc oxide nanoparticles are prepared in the same manner as in Preparation Example 1 except that the amount of gallium is changed into 12 mol %. The obtained zinc oxide nanoparticles are subjected to an ICP-AES analysis, a dynamic light scattering analysis, an UV-Vis absorption spectroscopy analysis, a photoluminescence spectroscopy analysis, an XPS analysis, and an UPS analysis, and the results are shown in Tables 1 and 3 and FIG. 6. Mole ratios of Ga:Zn and Mg:Zn are about 0.11:1 and about 0.14:1, respectively.

An amount of an organic material by performing TGA analysis is confirmed to be 23.4%.

Preparation Example 4

Zinc oxide nanoparticles are prepared in the same manner as in Preparation Example 1 except that the amount of gallium is changed into 15 mol %. The obtained zinc oxide nanoparticles are subjected to an ICP-AES analysis, a dynamic light scattering analysis, an UV-Vis absorption spectroscopy analysis, and a photoluminescence spectroscopy analysis, and the results are shown in Table 1 and FIG. 6. Mole ratios of Ga:Mg, (Mg+Ga):Zn, and Ga:(Zn+Mg+Ga) are 1.987:1, 0.309:1, and 0.157:1, respectively.

Preparation Example 5

Zinc oxide nanoparticles are prepared in the same manner as in Preparation Example 1 except that the amount of gallium is changed into 20 mol %. The obtained zinc oxide nanoparticles are subjected to an ICP-AES analysis, a dynamic light scattering analysis, an UV-Vis absorption spectroscopy analysis, and a photoluminescence spectroscopy analysis, and the results are shown in Table 1 and FIG. 6. Mole ratios of Ga:Zn and Mg:Zn are about 0.21:1 and about 0.09:1.

Comparative Preparation Example 1

Zinc oxide nanoparticles are prepared in the same manner as in Preparation Example 4 except that the nanoparticles of Reference Example 2 are used instead of the first nanoparticles of Reference Example 1 and TMAH is used instead of KOH.

An amount of an organic material by performing TGA analysis is confirmed to be 25%. The prepared particles have a first absorption peak wavelength of 305 nm, a DLS average diameter of 6.4 nm, and UPS (HOMO) of LUMO of each 7.31 eV and 3.74 eV (energy bandgap: 3.57 eV). The amount of gallium included in the particles is significantly smaller than that of Preparation Example 4.

TABLE 1

| | First absorption peak wavelength (nm), (X-intercept) | DLS avg. diameter (nm) | UPS HOMO (eV) | LUMO (eV) | Bandgap energy (eV) |
|---|---|---|---|---|---|
| Reference Example 1 | 311, 336.6 | 8.2 nm | 7.21 | 3.53 | 3.68 |
| Preparation Example 1 | 310, 335.6 | 6.6 nm | 7.28 | 3.59 | 3.69 |
| Preparation Example 2 | 306, 328.9 | 6.4 nm | 7.50 | 3.73 | 3.77 |
| Preparation Example 3 | 304, 327.8 | 6.3 nm | 7.53 | 3.75 | 3.78 |
| Preparation Example 4 | 303, 326.4 | 5.9 nm | — | — | — |
| Preparation Example 5 | 301, 325.2 | 5.5 nm | — | — | — |

TABLE 2

| | Zn | Mg | Ga | Ga:Mg | (Mg + Ga):Zn | Ga:(Zn + Mg + Ga) |
|---|---|---|---|---|---|---|
| Preparation Example 1 | 0.845 | 0.116 | 0.038 | 0.328:1 | 0.182:1 | 0.038:1 |
| Preparation Example 2 | 0.816 | 0.114 | 0.07 | 0.614:1 | 0.225:1 | 0.070:1 |
| Preparation Example 3 | 0.8 | 0.109 | 0.09 | 0.826:1 | 0.249:1 | 0.090:1 |
| Preparation Example 5 | 0.765 | 0.071 | 0.163 | 2.296:1 | 0.306:1 | 0.163:1 |

TABLE 3

| | Cl 2p | Ga 3d |
|---|---|---|
| Preparation Example 1 | 0.34 | 1.96 |
| Preparation Example 2 | 0.45 | 2.91 |
| Preparation Example 3 | 0.52 | 3.20 |

It is confirmed that optical properties and a bandgap energy of the zinc oxide nanoparticles change with increasing gallium content. Referring to the DLS results and the TGA analysis results of Table 1, the zinc oxide nanoparticles of the examples include an organic material in a reduced amount but maintain dispersibility. Referring to the results of FIG. 5, the nanoparticles of Preparation Example 1 may have improved crystallinity (excellent crystallinity), and each full width at half maximum of peaks corresponding to (100) and (101) crystal planes is about 1.3 degrees and about 2.4 degrees, respectively, in comparison with the nanoparticle prepared in reference Example 2 (for (100) crystal plane, 2.7 degrees and for (101) crystal plane, about 3.4 degrees. The peak analysis is conducted with a data analysis program, Origin manufactured by Origin Lab Corporation.

Referring to the XRD analysis results of the nanoparticles of Comparative Preparation Example 1, the nanoparticles of Comparative Preparation Example 1 have each wider full width at half maximum of (100) and (101) planes than the nanoparticles of Preparation Example 1, which implies that the nanoparticles of Comparative Preparation Example 1 have inferior crystallinity to the nanoparticles of Preparation Example 1.

FIG. 6 shows the PL spectroscopy analysis results of the first nanoparticles of the reference examples 1 and the synthesized nanoparticles of the preparation examples. The nanoparticles of the preparation examples exhibit a significantly reduced defect light emitting peak than that of the first nanoparticles of the reference example 1. A band edge emission peak thereof is identified between 350 nm to 400 nm.

Experimental Example 1: Electron Only Device (EOD) Analysis

The semiconductor nanoparticles of Synthesis Example 1 are dispersed in octane, preparing a semiconductor nanoparticle solution.

Each of the zinc oxide nanoparticles of Reference Example 2, Comparative Preparation Example 1, and Preparation Example 3 are dispersed in ethanol to provide respective first dispersions for forming ETL.

The nanoparticles (ZMO) of Reference Example 2 are dispersed in ethanol, preparing a second dispersion.

According to the following methods, an electron only device (EOD) with a structure of ITO/ZMO/EML/ETL/Al is manufactured:

The second dispersion is spin-coated on a glass substrate deposited with an ITO electrode (anode) and then, heat-treated at 80° C. for 30 minutes, forming an electron auxiliary layer (thickness: 30 nm).

On the electron auxiliary layer, the semiconductor nanoparticle solution is spin-coated, forming a light emitting layer having a thickness of about 20 nm. On the light emitting layer, the first dispersion is used to form an electron transport layer (thickness: 30 nm), and then, an Al electrode is deposited thereon.

Current density (mA/cm$^2$) is measured with a change in voltage; increasing (forward scan) and decreasing (backward scan) within a range of 0 to 8 V between the ITO electrode and the Al electrode, and the results are shown in Table 4.

TABLE 4

|  | Particles included in ETL | Current density at 5 volts | Current density at 8 volts |
|---|---|---|---|
| EOD 1 | Reference Example 2 | 10.4 | 72.87 |
| EOD 2 | Preparation Comparative Example 1 | 35.4 | 205.92 |
| EOD 3 | Preparation Example 3 | 249.1 | 862.36 |

Referring to the results of Table 4, an electron transport layer based on the nanoparticles of Preparation Example 3 exhibits significantly a higher current density, compared with the electron transport layers based on the nanoparticles of the reference example 2 and Comparative Preparation Example 1. Without wishing to be bound by any theory, the results may suggest that the nanoparticles of Preparation Example 3 are well trap-passivated.

Experimental Example 2: ETL Included Hole Only Device (HOD) Analysis

The semiconductor nanoparticles of Synthesis Example 1 are dispersed in octane, preparing a semiconductor nanoparticle solution.

Each of the zinc oxide nanoparticles of Reference Example 2 and Preparation Example 3 are dispersed in ethanol to provide Dispersion 1 and Dispersion 2 for forming an ETL.

According to the following method, a hole only device (HOD) with a structure of ITO/PEDOT/EML/ETL/organic HTL/Ag is manufactured:

After surface-treating a glass substrate deposited with ITO with UV-ozone for 15 minutes, a PEDOT:PSS solution (H.C. Starks, Inc.) is spin-coated thereon and heat-treated at 150° C. for 10 minutes under an air atmosphere and then, at 150° C. for 20 to 30 minutes under an N$_2$ atmosphere to form a 35 nm-thick hole auxiliary (injection) layer.

On the hole auxiliary layer, the semiconductor nanoparticle solution is spin-coated, forming a light emitting layer having a thickness of about 20 nm. On the light emitting layer, Dispersion 1 (Device 1) and Dispersion 2 (Device 2) are respectively used to form an electron transport layer (thickness: 20 nm). On the electron transport layer, organic HTL (GSH0137) is deposited. On organic HTL, an Al electrode is deposited.

Figure 7:
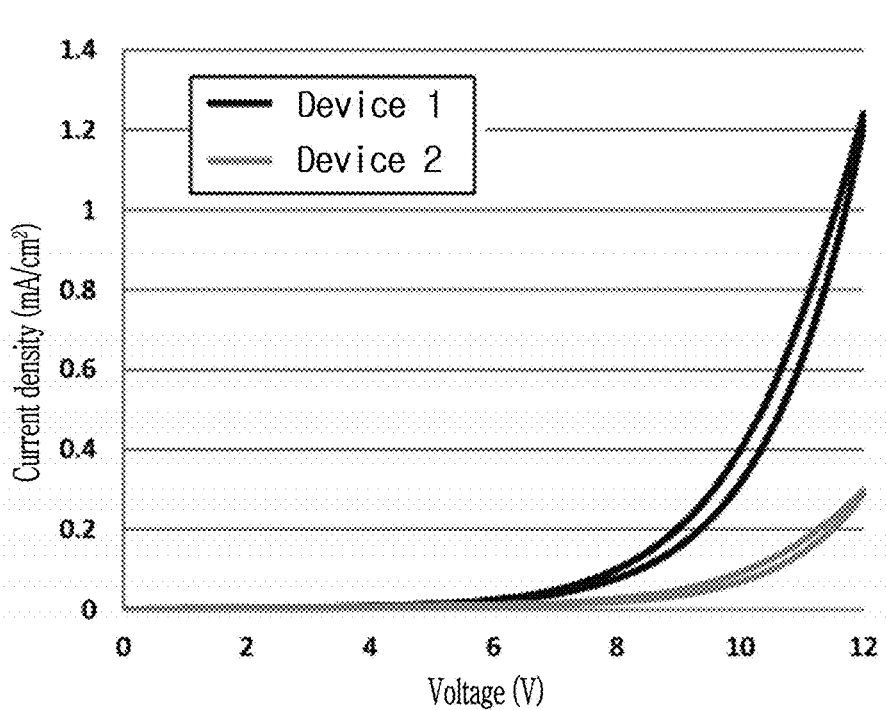
FIG. 7 shows physical properties of ETL included HOD devices produced in Experimental Example 2.

Between the ITO electrode and the Al electrode, a voltage within a range of 0 to 12 V may be increased (forward scan) or decreased (backward scan) to measure current density, and the results are shown in FIG. 7.

Referring to the results of FIG. 7, the HOD device (Device 2) including the electron transport layer including the nanoparticles of Preparation Example 3 exhibits a significantly reduced hole current, compared with the HOD device (Device 1) including the electron transport layer based on the nanoparticles of Reference Example 2, which suggests that the electron transport layer including the nanoparticles of Preparation Example 3 is significantly suppressed from a hole leak.

Production of Electroluminescent Device

Example 1

A semiconductor nanoparticle solution prepared by dispersing the semiconductor nanoparticles prepared in Synthesis Example 1 in octane is prepared. An ETL dispersion is prepared by dispersing the zinc oxide nanoparticles prepared in Preparation Example 3 in ethanol.

An electroluminescent device (ITO/PEDOT (35 nm)/TFB (25 nm)/QD light emitting layer (20 nm)/ETL (20 nm)/Al (100 nm)) is produced according to the following method:

after surface-treating a glass substrate deposited with ITO with UV-ozone for 15 minutes, a PEDOT:PSS solution (H.C. Starks, Inc.) is spin-coated thereon and heat-treated at 150° C. for 10 minutes under an air atmosphere and then, at 150° C. for 20 to 30 minutes under an N$_2$ atmosphere to form a 35 nm-thick hole injection layer.

On the hole injection layer, a poly[(9,9-dioctylfluorenyl-2,7-diyl-co (4,4'-(N-4-butylphenyl)diphenylamine] solution (TFB) (Sumitomo Corp.) is spin-coated and heat-treated at 150° C. for 30 minutes, forming a 25 nm-thick hole transport layer.

On the hole transport layer, the semiconductor nanoparticle solution of Synthesis Example 1 is spin-coated to form a 20 nm-thick light emitting layer.

On the light emitting layer, dispersion for ETL is spin-coated and heat-treated for 30 minutes, forming an electron auxiliary layer (thickness: 20 nm).

On the obtained electron auxiliary layer, aluminum (Al) is vacuum-deposited to be 100 nm thick, forming a second electrode and thus producing an electroluminescent device.

Electroluminescent properties and life-span of the produced electroluminescent device are measured and the results are shown in Table 5.

Example 2

An electroluminescent device is manufactured in the same manner as in Example 1 except that ETL dispersion prepared by dispersing the zinc oxide nanoparticles of Preparation Example 4 in ethanol is used. Electroluminescent properties and life-span of the produced electroluminescent device are measured and the results are shown in Table 5.

Example 3

An electroluminescent device is manufactured in the same manner as in Example 1 except that ETL dispersion prepared by dispersing the zinc oxide nanoparticles of Preparation Example 5 in ethanol is used. Electroluminescent properties and life-span of the produced electroluminescent device are measured and the results are shown in Table 5.

Comparative Example 1

An electroluminescent device is manufactured in the same manner as in Example 1 except that ETL dispersion prepared by dispersing the zinc oxide nanoparticles of Reference Example 2 in ethanol is used. Electroluminescent properties and life-span of the produced electroluminescent device are measured and the results are shown in Table 5.

TABLE 5

| | Nanoparticles in electron transport layer | Maximum EQE (%) | Maximum luminance (cd/m$^2$) | T90 (hour) | T50 (hour) |
|---|---|---|---|---|---|
| Example 1 | Preparation Example 3 | 10.7 | 107861 | 82.10 | 434.2 |
| Example 2 | Preparation Example 4 | 10.3 | 101516 | 63.37 | 358.5 |
| Example 3 | Preparation Example 5 | 9.6 | 98748 | 75.69 | 334.1 |
| Comparative Example 1 | Reference Example 2 | 9 | 91137 | 54 | 270 |
| Comparative Example 3 | Preparation Comparative Example 1 | 8 | 81023 | 31.78 | 218 |

Referring to the results of Table 5, the electroluminescent devices of Examples 1 to 3 exhibit improved electroluminescent properties and extended life-span characteristics, compared with the device of Comparative Example 1.

Comparative Example 2

An electroluminescent device is manufactured in the same manner as in Example 1 except that ETL dispersion prepared by dispersing the first nanoparticles of Reference Example 1 in ethanol is used. The electroluminescent device is measured with respect to electroluminescent properties and a life-span, which are inferior results to those of the electroluminescent device of Example 1.

Comparative Example 3

An electroluminescent device is manufactured in the same manner as in Example 1 except that ETL dispersion prepared by dispersing the nanoparticles of Comparative Preparation Example 1 in ethanol is used. The electroluminescent device is measured with respect to electroluminescent properties and a life-span, which are inferior results to those of the electroluminescent device of Example 1.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent device, comprising
a first electrode and a second electrode spaced apart from each other;
a light emitting layer disposed between the first electrode and the second electrode; and
an electron transport layer disposed between the light emitting layer and the second electrode,
wherein the light emitting layer comprises a plurality of semiconductor nanoparticles, and the electron transport layer comprises zinc oxide nanoparticles,
wherein the zinc oxide nanoparticle comprises magnesium and gallium, and in the zinc oxide nanoparticle, an amount of gallium is greater than or equal to about 1 mol % and less than or equal to about 30 mol %, based on total moles of zinc, magnesium, and gallium, and a mole ratio of gallium to magnesium (Ga:Mg) is less than or equal to about 3:1.

2. The electroluminescent device of claim 1, wherein the plurality of semiconductor nanoparticles does not comprise cadmium.

3. The electroluminescent device of claim 1, wherein in the zinc oxide nanoparticle, an amount of the gallium is greater than or equal to about 5 mol % and less than or equal to about 25 mol %, based on total moles of zinc, magnesium, and gallium.

4. The electroluminescent device of claim 1, wherein in the zinc oxide nanoparticle,
a mole ratio of gallium to zinc (Ga:Zn) is greater than or equal to about 0.03:1 and less than or equal to about 0.3:1,
a mole ratio of magnesium to zinc (Mg:Zn) is greater than or equal to about 0.05:1 and less than or equal to about 0.25:1,
a mole ratio of gallium to magnesium (Ga:Mg) is greater than or equal to about 0.3:1 and less than or equal to about 2.7:1, or
a mole ratio of a sum total of magnesium and gallium to zinc [(Mg+Ga):Zn] is greater than or equal to about 0.15:1 and less than or equal to about 0.5:1.

5. The electroluminescent device of claim 1, wherein in an X-ray diffraction analysis of the zinc oxide nanoparticle,
a full width at half maximum of a first peak corresponding to a (100) crystal plane is greater than or equal to about 0.5 degrees and less than or equal to about 8 degrees, and a full width at half maximum of a second peak corresponding to a (101) crystal plane is greater than or equal to about 0.5 degrees and less than or equal to about 8 degrees.

6. The electroluminescent device of claim 1, wherein the zinc oxide nanoparticle further comprises a halogen.

7. The electroluminescent device of claim 6, wherein in the zinc oxide nanoparticle, a mole ratio of halogen to gallium (halogen:gallium) is greater than or equal to about 0.01:1 and less than or equal to about 0.5:1.

8. The electroluminescent device of claim 1, wherein the zinc oxide nanoparticle forms a dispersion in a C1 to C10 alcohol solvent; and optionally wherein, in a dynamic light scattering analysis, the zinc oxide nanoparticles dispersed in the alcohol solvent exhibit an average particle diameter of greater than or equal to about 5 nanometers and less than or equal to about 8 nanometers.

9. The electroluminescent device of claim 1, wherein in the UV-Vis absorption spectrum, the zinc oxide nanoparticle exhibits a first absorption peak wavelength of greater than or equal to about 290 nanometers and less than or equal to about 311 nanometers.

10. The electroluminescent device of claim 1, wherein the zinc oxide nanoparticle has an average particle size of greater than or equal to about 1 nanometers and less than or equal to about 5 nanometers.

11. The electroluminescent device of claim 1, wherein the zinc oxide nanoparticle comprises a core-shell structure comprising a core comprising $Zn_{1-x}Mg_xO$ (wherein, $0<x\leq0.5$) and a shell disposed on the core, wherein the shell comprises gallium.

12. The electroluminescent device of claim 11, wherein a thickness of the shell is less than or equal to about 0.5 nanometers.

13. The electroluminescent device of claim 1, wherein the zinc oxide nanoparticle further comprises an alkali metal.

14. The electroluminescent device of claim 1, wherein the electroluminescent device is configured to emit blue light when a voltage is applied, and wherein the electroluminescent device has a maximum external quantum efficiency of from about 9% to about 40%, or the electroluminescent device has a maximum luminance of from about 50,000 candela per square meters to about 500,000 candela per square meters.

15. The electroluminescent device of claim 1, wherein the electroluminescent device exhibits a T90 of greater than or equal to about 50 hours and less than or equal to about 1000 hours, as operated at an initial luminance of 650 nit.

16. A display device comprising the electroluminescent device of claim 1.

17. The display device of claim 16, wherein the display device comprises a portable terminal device, a monitor, a notebook computer, a television, an electric sign board, a camera, or an electronic component of a vehicle.

18. A method of producing an electroluminescent device of claim 1, comprising forming the light emitting layer on the first electrode;

applying a solution comprising the zinc oxide nanoparticles onto the light emitting layer to form the electron transport layer; and forming the second electrode on the electron transport layer, wherein the zinc oxide nanoparticles are prepared by a method comprising:

stirring a solvent mixture comprising a first solvent and a second solvent;

adding a zinc precursor and a magnesium precursor to the solvent mixture and dissolving the precursors to obtain a first solution;

adding a first base to the first solution and reacting at a first temperature to form first nanoparticles;

isolating the formed first nanoparticles, and optionally, washing the first nanoparticles;

dispersing the isolated first nanoparticles in a third solvent; and adding a gallium precursor and a second base to the third solvent and conducting a reaction involving the gallium precursor at a second temperature to form the zinc oxide nanoparticle, wherein the first solvent and second solvent have a relative polarity difference of greater than or equal to about 0.3 and less than or equal to about 0.9.

19. The method of claim 18, wherein the first solvent is a C1 to C10 alcohol solvent and the second solvent is a C3 to C30 hydrocarbon solvent, and optionally, the third solvent is a C1 to C10 alcohol solvent, dimethylsulfoxide, a C3 to C30 hydrocarbon solvent, or a combination thereof; or wherein the dissolving of the precursors comprises heating them to a predetermined temperature and the predetermined temperature is greater than or equal to about 40° C. and less than or equal to about 78° C.; or wherein the first base, and optionally, the second base comprise an inorganic base, and does not comprise tetramethylammonium hydroxide.

20. The method of claim 18, wherein the zinc precursor and the magnesium precursor are added in powder form, or the gallium precursor comprises gallium halide.

* * * * *